United States Patent
Shen et al.

(10) Patent No.: US 10,516,417 B2
(45) Date of Patent: Dec. 24, 2019

(54) POLAR CODE ENCODING METHOD AND ENCODING APPARATUS

(71) Applicant: Huawei Technologies Co., Ltd., Shenzhen (CN)

(72) Inventors: Hui Shen, Shenzhen (CN); Bin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 166 days.

(21) Appl. No.: 15/629,498

(22) Filed: Jun. 21, 2017

(65) Prior Publication Data

US 2017/0288703 A1   Oct. 5, 2017

Related U.S. Application Data

(63) Continuation of application No. PCT/CN2014/094475, filed on Dec. 22, 2014.

(51) Int. Cl.
*H03M 13/00* (2006.01)
*H03M 13/27* (2006.01)
(Continued)

(52) U.S. Cl.
CPC ....... *H03M 13/2792* (2013.01); *H03M 13/13* (2013.01); *H03M 13/275* (2013.01); *H04L 1/0071* (2013.01)

(58) Field of Classification Search
CPC .. H03M 13/2792; H03M 13/13; H03M 13/15; H03M 13/275; H03M 13/635; H04L 1/0041; H04L 1/007; H04L 1/0071
See application file for complete search history.

(56) References Cited

U.S. PATENT DOCUMENTS 5,799,033 A   8/1998   Baggen
8,543,884 B2  9/2013   Mansour
(Continued)

FOREIGN PATENT DOCUMENTS

CN   1357172 A    7/2002
CN   101159513 A  4/2008
(Continued)

OTHER PUBLICATIONS

Miyamoto et al.,"Performance Evaluation of Sparse Superposition Codes by Numerical Experiments", IEICE Technical Report, Information Theory vol. 114 No. 34, Institute of Electronics, Information and Communication Engineers, pp. 49-45, Tokyo, Japan (May 2014).
(Continued)

*Primary Examiner* — Christine T. Tu
(74) *Attorney, Agent, or Firm* — Leydig, Voit & Mayer, Ltd.

(57) ABSTRACT

The present invention discloses a polar code encoding method and encoding apparatus. The method includes: mapping M reserved bits of a broadcast signaling respectively to M low-reliability information bits in K information bits of a polar code, and mapping remaining bits of the broadcast signaling to remaining information bits of the K information bits, to obtain bits after mapping, where M<K, and both M and K are positive integers; and performing polar code encoding on the bits after mapping, to obtain coded bits after encoding. Embodiments of the present invention can improve broadcast signaling transmission reliability.

12 Claims, 7 Drawing Sheets

---

Map M reserved bits of broadcast signaling respectively to M low-reliability information bits in K information bits of a polar code, and map remaining bits of the broadcast signaling to remaining information bits of the K information bits, to obtain bits after mapping, where M<K, and both M and K are positive integers — 301

Perform polar code encoding on the bits after mapping, to obtain coded bits after encoding — 302

(51) Int. Cl.
H03M 13/13 (2006.01)
H04L 1/00 (2006.01)

(56) References Cited

U.S. PATENT DOCUMENTS

| | | | |
|---|---|---|---|
| 9,628,113 | B2* | 4/2017 | Jeong ................ H03M 13/2906 |
| 2002/0032890 | A1 | 3/2002 | Rowitch et al. |
| 2004/0146029 | A1 | 7/2004 | Tong et al. |
| 2006/0256708 | A1 | 11/2006 | Wang et al. |
| 2008/0141031 | A1 | 6/2008 | Oba et al. |
| 2008/0301536 | A1 | 12/2008 | Shin et al. |
| 2012/0198305 | A1 | 8/2012 | Abu-Surra et al. |
| 2013/0318416 | A1 | 11/2013 | Tong et al. |
| 2013/0343271 | A1 | 12/2013 | El-Khamy et al. |
| 2014/0016570 | A1 | 1/2014 | Ma et al. |
| 2014/0019820 | A1 | 1/2014 | Vardy et al. |
| 2014/0108748 | A1 | 4/2014 | Lee et al. |
| 2014/0169492 | A1 | 6/2014 | Mahdavifar et al. |
| 2014/0173376 | A1 | 6/2014 | Jeong et al. |
| 2015/0194987 | A1 | 7/2015 | Li et al. |
| 2016/0020926 | A1 | 1/2016 | Chen et al. |
| 2016/0079999 | A1 | 3/2016 | Shen et al. |
| 2016/0182187 | A1 | 6/2016 | Kim et al. |
| 2017/0288703 | A1 | 10/2017 | Shen et al. |
| 2018/0331788 | A1* | 11/2018 | Kim ..................... H04L 1/1893 |
| 2019/0166611 | A1* | 5/2019 | Noh .................. H04W 72/1273 |

FOREIGN PATENT DOCUMENTS

| | | |
|---|---|---|
| CN | 102164025 A | 8/2011 |
| CN | 103023618 A | 4/2013 |
| CN | 103220083 A | 7/2013 |
| CN | 103281166 A | 9/2013 |
| CN | 103684477 A | 3/2014 |
| CN | 104219019 A | 12/2014 |
| EP | 2824841 B1 | 4/2016 |
| JP | 2001057521 A | 2/2001 |
| JP | 2009033340 A | 2/2009 |
| JP | 2010502040 A | 1/2010 |
| JP | 2011139475 A | 7/2011 |
| KR | 20130035407 A | 4/2013 |
| KR | 20130140780 A1 | 12/2013 |
| RU | 2186459 C2 | 7/2002 |
| RU | 2235424 C2 | 8/2004 |
| RU | 2375822 C2 | 12/2009 |
| RU | 2376702 C2 | 12/2009 |
| WO | 2013152605 A1 | 10/2013 |
| WO | 2013191435 A1 | 12/2013 |
| WO | 2014098480 A1 | 6/2014 |

OTHER PUBLICATIONS

Cadambe et al.,"Interference Alignment and Spatial Degrees of Freedom for the K User Interference Channel," 2008 IEEE International Conference on Communications, pp. 971-975, Institute of Electrical and Electronics Engineers, New York, New York (2008).
"Design of DL transport Channel Processing and Multiplexing," 3GPP TSG-RAN WG1#76 R1-140250, 3rd Generation Partnership Project, Valbonne, France (Feb. 10-14, 2014).
"Text proposal for Section 6.2.4 of TR 25.892", 3GPP TSG-RAN-1 Ad Hoc, Espoo, Finland, XP50111968, R1-040041, 3rd Generation Partnership Project, Valbonne, France (Jan. 27-30, 2004).
"Interleaver Structures for Coded Systems; Pseudorandom Interleavers", error correction coding for digital communications, XP-002131001, pp. 349-352, Chapter 8, System Applications, (1981).
Jung-Fu "Coding Performance of HARQ with BICM Part II: LTE Circular Buffer Rate Matching & Extension," XP31837845, 2010 IEEE personal indoor and mobile radio communications, Institute of Electrical and Electronics Engineers, New York, New York (2010).
"Performance Evaluation of Rate Matching Algorithms," 3GPP TSG-RAN WG1#49, Kobe, Japan, R1-072452, 3rd Generation Partnership Project, Valbonne, France (May 7-11, 2007).
Arikan "Channel polarization: A method for constructing capacity-achieving codes for symmetric binary-input memoryless channels," IEEE Trans. Inform. Theory, vol. 55, pp. 3051-3073, Institute of Electrical and Electronics Engineers, New York, New York (Jul. 2009).
Tal et al., "List Decoding of Polar Codes", in Proc of ISIT 2011, (May 2012).
Cadambe et al., "Interference Alignment and Degrees of Freedom of the K-User Interference Channel," IEEE Transactions on Information Theory, vol. 54, No. 8, Institute of Electrical and Electronics Engineers, New York, New York (Aug. 2008).
Li et al., 'Parallel Decoders of Polar Codes', IEEE pp. 1-4, Institute of Electrical and Electronics Engineers, New York, New York (2013).
Niu et al., 'Polar Codes: Primary Concepts and Practical Decoding Algorithms', IEEE Communications Magazine, pp. 192-203, Institute of Electrical and Electronics Engineers, New York, New York, (Jul. 2014).
Chen et al.,"A Hybrid ARQ Scheme Based on Polar Codes," IEEE Communications Letters, vol. 17, No. 10, pp. 1996-1999, Institute of Electrical and Electronics Engineers, New York, New York (Oct. 2013).
Chen et al.,"Polar Coded HARQ Scheme with Chase Combining," arXiv:1310.6650v2[cs.IT] (Jan. 10, 2014).

* cited by examiner

POLAR CODE ENCODING METHOD AND ENCODING APPARATUS

CROSS-REFERENCE TO RELATED APPLICATIONS

This application is a continuation of International Application No. PCT/CN2014/094475, filed on Dec. 22, 2014, the disclosure of which is hereby incorporated by reference in its entirety.

TECHNICAL FIELD

Embodiments of the present invention relate to the field of encoding and decoding, and more specifically, to a polar code encoding method and encoding apparatus.

BACKGROUND

In a communications system, channel encoding is usually performed to improve data transmission reliability and ensure communication quality. A polar code is an encoding manner that can achieve a Shannon capacity and has low coding-decoding complexity. The polar code is a linear block code, including one or more information bits and one or more frozen bits. A generator matrix of the polar code is $G_N$, and an encoding process of the polar code is $X_1^N = u_1^N G_N$, where $u_1^N = \{u_1, u_2, \ldots, u_N\}$ is a binary row vector with a length of N.

SUMMARY

When a polar code is used for channel encoding of a physical broadcast channel (PBCH), broadcast channel transmission reliability can be further improved.

Embodiments of the present invention provide a polar code encoding method and encoding apparatus, so as to improve broadcast signaling transmission reliability.

According to a first aspect, an embodiment of the present invention provides a polar code encoding method, including:

mapping M reserved bits of a broadcast signaling respectively to M low-reliability information bits in K information bits of a polar code, and mapping remaining bits of the broadcast signaling to remaining information bits of the K information bits, to obtain bits after mapping, where M<K, and both M and K are positive integers; and performing polar code encoding on the bits after mapping, to obtain coded bits after encoding.

With reference to the first aspect, in a first implementation manner of the first aspect, the M low-reliability information bits include M information bits with reliability lower than a preset threshold, or the M low-reliability information bits include M information bits with lowest reliability in the K information bits.

With reference to the first aspect and the foregoing implementation manner of the first aspect, in a second implementation manner of the first aspect, before the mapping M reserved bits of a broadcast signaling respectively to M low-reliability information bits in K information bits of a polar code, the encoding method further includes:

sorting the K information bits according to reliability of the K information bits.

With reference to the first aspect and the foregoing implementation manners of the first aspect, in a third implementation manner of the first aspect, the reliability of one of the K information bits is determined according to a bit capacity, a Bhattacharyya parameter such as a Bhattacharyya distance, or an error probability.

With reference to the first aspect and the foregoing implementation manners of the first aspect, in a fourth implementation manner of the first aspect, after the performing polar code encoding on the bits after mapping, to obtain coded bits after encoding, the encoding method further includes:

performing sorted congruential interleaving on the coded bits after encoding, to obtain coded bits after interleaving; and inputting, according to a preset value E, the first E bits of the coded bits after interleaving into a cyclic buffer; or performing order-reversing processing on the coded bits after interleaving, and inputting, according to a preset value E, the first E bits of the coded bits after order-reversing processing into a cyclic buffer.

With reference to the first aspect and the foregoing implementation manners of the first aspect, in a fifth implementation manner of the first aspect, the performing sorted congruential interleaving on the coded bits after encoding, to obtain coded bits after interleaving includes:

obtaining a congruential sequence according to a length of the coded bits after encoding;

performing sorting processing on the congruential sequence according to a preset rule, to obtain a reference sequence;

determining a mapping function according to the congruential sequence and the reference sequence; and interleaving the coded bits after encoding according to the mapping function, to obtain the coded bits after interleaving.

With reference to the first aspect and the foregoing implementation manners of the first aspect, in a sixth implementation manner of the first aspect, the obtaining a congruential sequence according to a length of the coded bits after encoding includes:

determining the congruential sequence according to the following formula:

$x(0) = x_0$;

and $x(n+1) = [a*x(n)+c] \mod m$, where $n = 0, 1, \ldots, (N-2)$, where N is the length of the coded bits of the polar code after encoding, $x_0$, a, c, and m are particular parameters, and $x(0), x(1), \ldots, x(N-1)$ is the congruential sequence.

According to a second aspect, an embodiment of the present invention provides an encoding apparatus, including:

a mapping unit, configured to: map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers; and an encoding unit, configured to perform polar code encoding on the bits after mapping, to obtain coded bits after encoding.

With reference to the second aspect, in a first implementation manner of the second aspect, the M low-reliability information bits include M information bits with reliability lower than a preset threshold, or the M low-reliability information bits include M information bits with lowest reliability in the K information bits.

With reference to the second aspect and the foregoing implementation manner of the second aspect, in a second implementation manner of the second aspect, the encoding apparatus further includes a sorting unit, configured to sort the K information bits according to reliability of the K information bits.

With reference to the second aspect and the foregoing implementation manners of the second aspect, in a third implementation manner of the second aspect, the reliability of one of the K information bits is determined according to a bit capacity, a Bhattacharyya parameter such as a Bhattacharyya distance, or an error probability.

With reference to the second aspect and the foregoing implementation manners of the second aspect, in a fourth implementation manner of the second aspect, the encoding apparatus further includes an interleaving unit and a capturing unit, where the interleaving unit is configured to perform sorted congruential interleaving on the coded bits after encoding, to obtain coded bits after interleaving; and the capturing unit is configured to input, according to a preset value E, the first E bits of the coded bits after interleaving into a cyclic buffer; or configured to: perform order-reversing processing on the coded bits after interleaving, and input, according to a preset value E, the first E bits of the coded bits after order-reversing processing into a cyclic buffer.

With reference to the second aspect and the foregoing implementation manners of the second aspect, in a fifth implementation manner of the second aspect, the interleaving unit is configured to:

obtain a congruential sequence according to a length of the coded bits after encoding;

perform sorting processing on the congruential sequence according to a preset rule, to obtain a reference sequence;

determine a mapping function according to the congruential sequence and the reference sequence; and interleave the coded bits after encoding according to the mapping function, to obtain the coded bits after interleaving.

With reference to the second aspect and the foregoing implementation manners of the second aspect, in a sixth implementation manner of the second aspect, the interleaving unit is configured to determine the congruential sequence according to the following formula:

$x(0)=x_0$;

and $x(n+1)=[a*x(n)+c]\mod m$, where $n=0,1,\ldots,(N-2)$, where N is the length of the coded bits of the polar code after encoding, $x_0$, a, c, and m are particular parameters, and $x(0), x(1), \ldots, x(N-1)$ is the congruential sequence.

According to a third aspect, an embodiment of the present invention provides a polar code rate matching method, including:

obtaining a congruential sequence according to a length of coded bits of a polar code of a control signaling;

performing sorting processing on the congruential sequence according to a preset rule, to obtain a reference sequence;

determining a mapping function according to the congruential sequence and the reference sequence; and interleaving the coded bits of the polar code of the control signaling according to the mapping function, to generate coded bits after interleaving.

With reference to the third aspect, in a first implementation manner of the third aspect, the control signaling is a broadcast signaling, and the method further includes:

inputting, according to a preset value E, the first E bits of the coded bits after interleaving into a cyclic buffer; or performing order-reversing processing on the coded bits after interleaving, and inputting, according to a preset value E, the first E bits of the coded bits after order-reversing processing into a cyclic buffer.

With reference to the third aspect and the foregoing implementation manner of the third aspect, in a second implementation manner of the third aspect, the obtaining a congruential sequence according to a length of coded bits of a polar code of a control signaling includes:

determining the congruential sequence according to the following formula:

$x(0)=x_0$;

and $x(n+1)=[a*x(n)+c]\mod m$, where $n=0, 1, \ldots, (N-2)$, where N is the length of the coded bits of the polar code of the control signaling, $x_0$, a, c, and m are particular parameters, and $x(0), x(1), \ldots, x(N-1)$ is the congruential sequence.

With reference to the third aspect and the foregoing implementation manners of the third aspect, in a third implementation manner of the third aspect, $a=7^5$, $c=0$, and $m=2^{31}-1$.

With reference to the third aspect and the foregoing implementation manners of the third aspect, in a fourth implementation manner of the third aspect, the control signaling includes but is not limited to one of the following control channels: a physical downlink control channel (PDCCH), a physical broadcast channel (PBCH), or a physical uplink control channel (PUCCH).

With reference to the third aspect and the foregoing implementation manners of the third aspect, in a fifth implementation manner of the third aspect, when N=128, the mapping function is:

{0, 112, 35, 14, 48, 1, 99, 54, 28, 120, 126, 46, 114, 110, 43, 32, 81, 18, 113, 63, 75, 38, 64, 7, 15, 37, 19, 70, 27, 12, 34, 50, 17, 86, 3, 68, 98, 23, 111, 62, 57, 61, 89, 59, 13, 56, 66, 107, 47, 41, 124, 30, 2, 49, 44, 88, 65, 45, 123, 104, 10, 85, 102, 103, 122, 91, 121, 58, 73, 60, 26, 8, 55, 105, 94, 82, 115, 69, 74, 83, 106, 95, 9, 108, 53, 90, 29, 11, 36, 42, 87, 39, 101, 76, 4, 67, 93, 31, 97, 119, 100, 72, 6, 5, 22, 118, 25, 117, 125, 92, 80, 77, 21, 79, 116, 33, 20, 71, 52, 109, 84, 51, 96, 24, 40, 78, 16, 127}.

With reference to the third aspect and the foregoing implementation manners of the third aspect, in a sixth implementation manner of the third aspect, when N=256, the mapping function is:

{0, 188, 112, 128, 183, 35, 150, 14, 48, 149, 148, 154, 130, 1, 229, 152, 131, 197, 182, 248, 253, 99, 54, 245, 231, 165, 28, 226, 120, 132, 136, 185, 168, 196, 187, 200, 159, 211, 147, 126, 46, 157, 114, 110, 210, 43, 32, 81, 18, 113, 63, 158, 75, 222, 38, 170, 219, 208, 237, 220, 252, 64, 137, 230, 216, 133, 7, 192, 218, 15, 37, 217, 19, 70, 27, 173, 155, 12, 34, 239, 50, 207, 175, 169, 223, 242, 240, 17, 161, 86, 3, 68, 98, 23, 145, 111, 62, 189, 202, 57, 61, 89, 59, 13, 56, 66, 199, 167, 214, 179, 215, 221, 107, 47, 41, 124, 234, 30, 2, 49, 44, 88, 201, 65, 195, 205, 45, 123, 104, 10, 85, 193, 102, 177, 103, 122, 225, 241, 181, 227, 91, 172, 121, 58, 142, 174, 73, 134, 60, 250, 180, 26, 8, 55, 236, 105, 94, 235, 194, 82, 162, 160, 243, 115, 69, 74, 83, 106, 191, 95, 232, 9, 108, 206, 53, 212, 209, 90, 29, 11, 139, 36, 42, 87, 39, 178, 101, 144, 151, 138, 247, 76, 4, 238, 143, 67, 146, 93, 254, 31, 198, 97, 119, 100, 171, 163, 204, 72, 6, 5, 22, 118, 190, 233, 141, 213, 25, 117, 125, 92, 246, 153, 80, 186, 135, 77, 251, 21, 79, 249, 116, 203, 164, 129, 33, 20, 71, 184, 52, 244, 109, 84, 51, 96, 24, 255, 40, 224, 176, 78, 140, 228, 16, 127, 166, 156}.

According to a fourth aspect, an embodiment of the present invention provides a polar code rate matching apparatus, including:

an obtaining unit, configured to obtain a congruential sequence according to a length of coded bits of a polar code of a control signaling;

a sorting unit, configured to perform sorting processing on the congruential sequence according to a preset rule, to obtain a reference sequence;

a determining unit, configured to determine a mapping function according to the congruential sequence and the reference sequence; and an interleaving unit, configured to interleave the coded bits of the polar code of the control signaling according to the mapping function, to generate coded bits after interleaving.

With reference to the fourth aspect, in a first implementation manner of the fourth aspect, the control signaling is a broadcast signaling, and the rate matching apparatus further includes a capturing unit, where the capturing unit is configured to:

input, according to a preset value E, the first E bits of the coded bits after interleaving into a cyclic buffer; or perform order-reversing processing on the coded bits after interleaving, and input, according to a preset value E, the first E bits of the coded bits after order-reversing processing into a cyclic buffer.

With reference to the fourth aspect and the foregoing implementation manner of the fourth aspect, in a second implementation manner of the fourth aspect, the obtaining unit is configured to determine the congruential sequence according to the following formula:

$x(0) = x_0$;

and $x(n+1) = [a*x(n)+c] \bmod m$, where $n = 0, 1, \ldots, (N-2)$, where N is the length of the coded bits of the polar code of the control signaling, $x_0$, a, c, and m are particular parameters, and x(0) x(1), ..., x(N−1) is the congruential sequence.

With reference to the fourth aspect and the foregoing implementation manners of the fourth aspect, in a third implementation manner of the fourth aspect, $a = 7^5$, $c = 0$, and $m = 2^{31} - 1$.

With reference to the fourth aspect and the foregoing implementation manners of the fourth aspect, in a fourth implementation manner of the fourth aspect, the control signaling includes but is not limited to one of the following control channels: a physical downlink control channel (PDCCH), a physical broadcast channel (PBCH), or a physical uplink control channel (PUCCH).

With reference to the fourth aspect and the foregoing implementation manners of the fourth aspect, in a third implementation manner of the fourth aspect, when N=128, the mapping function is:

{0, 112, 35, 14, 48, 1, 99, 54, 28, 120, 126, 46, 114, 110, 43, 32, 81, 18, 113, 63, 75, 38, 64, 7, 15, 37, 19, 70, 27, 12, 34, 50, 17, 86, 3, 68, 98, 23, 111, 62, 57, 61, 89, 59, 13, 56, 66, 107, 47, 41, 124, 30, 2, 49, 44, 88, 65, 45, 123, 104, 10, 85, 102, 103, 122, 91, 121, 58, 73, 60, 26, 8, 55, 105, 94, 82, 115, 69, 74, 83, 106, 95, 9, 108, 53, 90, 29, 11, 36, 42, 87, 39, 101, 76, 4, 67, 93, 31, 97, 119, 100, 72, 6, 5, 22, 118, 25, 117, 125, 92, 80, 77, 21, 79, 116, 33, 20, 71, 52, 109, 84, 51, 96, 24, 40, 78, 16, 127}.

With reference to the fourth aspect and the foregoing implementation manners of the fourth aspect, in a third implementation manner of the fourth aspect, when N=256, the mapping function is:

{0, 188, 112, 128, 183, 35, 150, 14, 48, 149, 148, 154, 130, 1, 229, 152, 131, 197, 182, 248, 253, 99, 54, 245, 231, 165, 28, 226, 120, 132, 136, 185, 168, 196, 187, 200, 159, 211, 147, 126, 46, 157, 114, 110, 210, 43, 32, 81, 18, 113, 63, 158, 75, 222, 38, 170, 219, 208, 237, 220, 252, 64, 137, 230, 216, 133, 7, 192, 218, 15, 37, 217, 19, 70, 27, 173, 155, 12, 34, 239, 50, 207, 175, 169, 223, 242, 240, 17, 161, 86, 3, 68, 98, 23, 145, 111, 62, 189, 202, 57, 61, 89, 59, 13, 56, 66, 199, 167, 214, 179, 215, 221, 107, 47, 41, 124, 234, 30, 2, 49, 44, 88, 201, 65, 195, 205, 45, 123, 104, 10, 85, 193, 102, 177, 103, 122, 225, 241, 181, 227, 91, 172, 121, 58, 142, 174, 73, 134, 60, 250, 180, 26, 8, 55, 236, 105, 94, 235, 194, 82, 162, 160, 243, 115, 69, 74, 83, 106, 191, 95, 232, 9, 108, 206, 53, 212, 209, 90, 29, 11, 139, 36, 42, 87, 39, 178, 101, 144, 151, 138, 247, 76, 4, 238, 143, 67, 146, 93, 254, 31, 198, 97, 119, 100, 171, 163, 204, 72, 6, 5, 22, 118, 190, 233, 141, 213, 25, 117, 125, 92, 246, 153, 80, 186, 135, 77, 251, 21, 79, 249, 116, 203, 164, 129, 33, 20, 71, 184, 52, 244, 109, 84, 51, 96, 24, 255, 40, 224, 176, 78, 140, 228, 16, 127, 166, 156}.

Based on the foregoing technical solutions, when a broadcast signaling (such as a PBCH) is sent, mapping is first performed according to reliability of information bits in a polar code, and then polar code encoding is performed on bits after mapping. In this way, useful bits in the broadcast signaling can be prevented from being mapped to low-reliability information bits, thereby improving encoding performance of the polar code.

BRIEF DESCRIPTION OF DRAWINGS

To describe technical solutions in embodiments of the present invention more clearly, the following briefly describes the accompanying drawings for describing the embodiments of the present invention. The accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
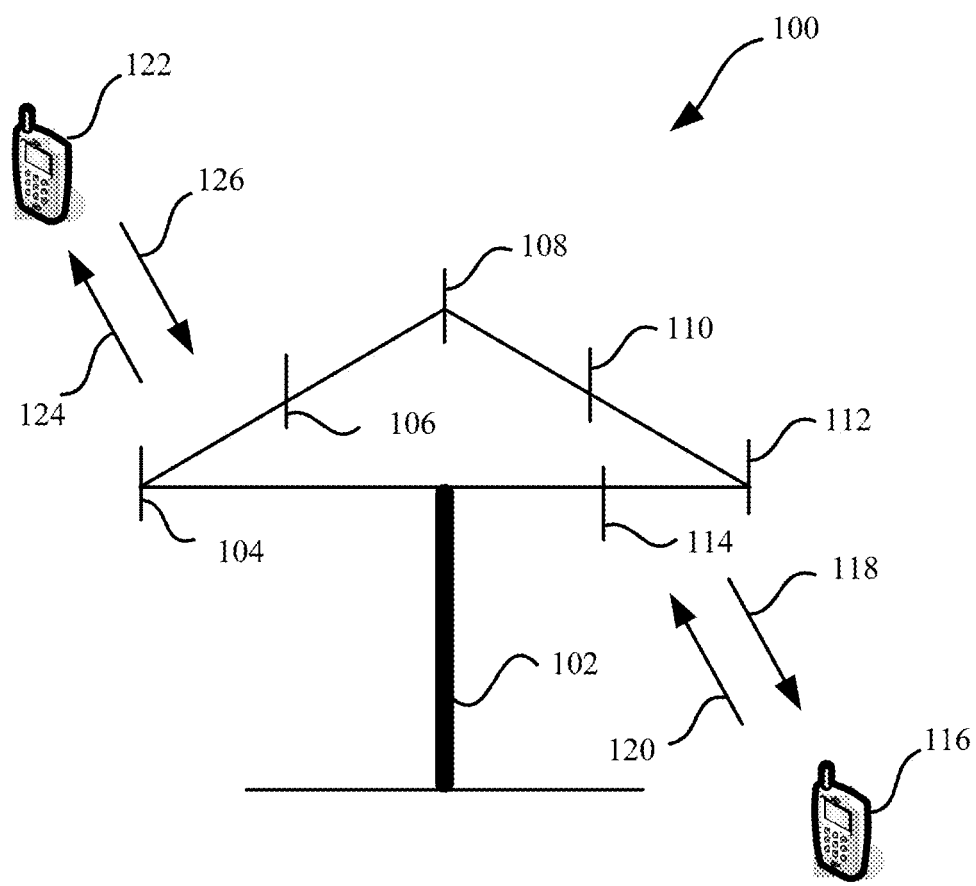
FIG. 1 shows a wireless communications system according to embodiments of this specification.

The following clearly describes technical solutions in embodiments of the present invention with reference to the accompanying drawings. The described embodiments are a part rather than all of the embodiments of the present invention. All other embodiments obtained by a person of ordinary skill in the art based on the embodiments of the present invention without creative efforts shall fall within the protection scope of the present invention.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. Both a computing device and an application that runs on the computing device may be components. One or more components may reside within a process and/or a thread of execution, and a component may be located on one computer and/or distributed between two or more computers. In addition, these components may be executed from various computer-readable media that store various data structures. For example, the components may communicate using a local and/or remote process and according to, for example, a signal having one or more data packets (for example, data from one component interacting with another component in a local system, a distributed system, and/or across a network such as the Internet interacting with other systems using the signal).

In addition, the embodiments are described with reference to an access terminal. An access terminal may also be referred to as a system, a subscriber unit, a subscriber station, a mobile station, a mobile, a remote station, a remote terminal, a mobile device, a user terminal, a terminal, a wireless communications device, a user agent, a user apparatus, or UE (user equipment). The access terminal may be a cellular phone, a cordless phone, a SIP (Session Initiation Protocol) phone, a WLL (wireless local loop) station, a PDA (personal digital assistant), a handheld device having a wireless communication function, a computing device, or another processing device connected to a wireless modem. In addition, the embodiments are described with reference to a base station. A base station can be used to communicate with a mobile device; and the base station may be a base transceiver station (BTS) in Global System for Mobile communication (GSM) or Code Division Multiple Access (CDMA); or may be a NodeB (NB) in Wideband Code Division Multiple Access (WCDMA); or may further be an evolved Node B (eNB or eNodeB) in Long Term Evolution (LTE), a relay station or an access point, a base station device in a future 5G network, or the like.

In addition, aspects or features of the present invention may be implemented as a method, an apparatus or a product that uses standard programming and/or engineering technologies. The term "product" used in this application covers a computer program that can be accessed from any computer readable component, carrier or medium. For example, the computer readable medium may include but is not limited to: a magnetic storage component (for example, a hard disk, a floppy disk or a magnetic tape), an optical disc (for example, a Compact Disk (CD), a Digital Versatile Disk (DVD), a smart card and a flash memory component (for example, Erasable Programmable Read-Only Memory (EPROM), a card, a stick, or a key drive). In addition, various storage media described in this specification may indicate one or more devices and/or other machine-readable media that is used to store information. The term "machine readable media" may include but is not limited to a radio channel, and various other media that can store, contain and/or carry an instruction and/or data.

FIG. 1 shows a wireless communications system 100 according to embodiments of this specification. The system 100 includes a base station 102. The base station 102 may include multiple antenna groups. For example, one antenna group may include an antenna 104 and an antenna 106, another antenna group may include an antenna 108 and an antenna 110, and an additional group may include an antenna 112 and an antenna 114. For each antenna group, two antennas are shown; however, more or fewer antennas may be used for each group. The base station 102 may additionally include a transmitter chain and a receiver chain, and a person of ordinary skill in the art may understand that both the transmitter chain and the receiver chain may include multiple components (for example, a processor, a modulator, a multiplexer, a demodulator, a demultiplexer, and an antenna) related to signal sending and receiving.

The base station 102 may communicate with one or more access terminals (for example, an access terminal 116 and an access terminal 122). However, it may be understood that the base station 102 may communicate with basically any quantity of access terminals similar to the access terminal 116 and the access terminal 122. The access terminal 116 and the access terminal 122 may be, for example, a cellular phone, a smartphone, a portable computer, a handheld communications device, a handheld computing device, a satellite radio apparatus, a global positioning system, a PDA, and/or any other suitable device configured to perform communication in the wireless communications system 100. As shown in the figure, the access terminal 116 communicates with the antenna 112 and the antenna 114, and the antenna 112 and the antenna 114 send information to the access terminal 116 using a forward link 118, and receive information from the access terminal 116 using a reverse link 120. In addition, the access terminal 122 communicates with the antenna 104 and the antenna 106, and the antenna 104 and the antenna 106 send information to the access terminal 122 using a forward link 124, and receive information from the access terminal 122 using a reverse link 126. In an FDD (frequency division duplex) system, for example, the forward link 118 may use a frequency band different from a frequency band used by the reverse link 120, and the forward link 124 may use a frequency band different from a frequency band used by the reverse link 126. In addition, in a TDD (time division duplex) system, the forward link 118 and the reverse link 120 may use a same frequency band, and the forward link 124 and the reverse link 126 may use a same frequency band.

Each antenna group and/or an area designed for communication is referred to as a sector of the base station 102. For example, an antenna group may be designed to communicate with an access terminal in a sector in coverage of the base station 102. In communication by means of the forward link 118 and the forward link 124, a transmit antenna of the base station 102 may improve, by means of beamforming, signal-to-noise ratios of the forward link 118 and the forward link 124 for the access terminal 116 and the access terminal 122. In addition, compared with sending, by the base station using a single antenna, information to all access terminals of the base station, when the base station 102 sends, by means of beamforming, information to the access terminal 116 and the access terminal 122 that are distributed randomly in related coverage, less interference is caused to a mobile device in a neighboring cell.

In a given time, the base station 102, the access terminal 116, and/or the access terminal 122 may be a wireless communications apparatus for sending and/or a wireless communications apparatus for receiving. When sending data, the wireless communications apparatus for sending may encode the data for transmission. The wireless communications apparatus for sending may have (for example, generate, obtain, or save in a memory) a particular quantity of information bits to be sent, using a channel, to the wireless communications apparatus for receiving. The information bits may be included in a transport block (or multiple transport blocks) of data, and the transport block may be segmented to produce multiple code blocks. In addition, the wireless communications apparatus for sending may encode each code block using a polar code encoder (which is not shown), so as to improve data transmission reliability, and further ensure communication quality.

Figure 2:
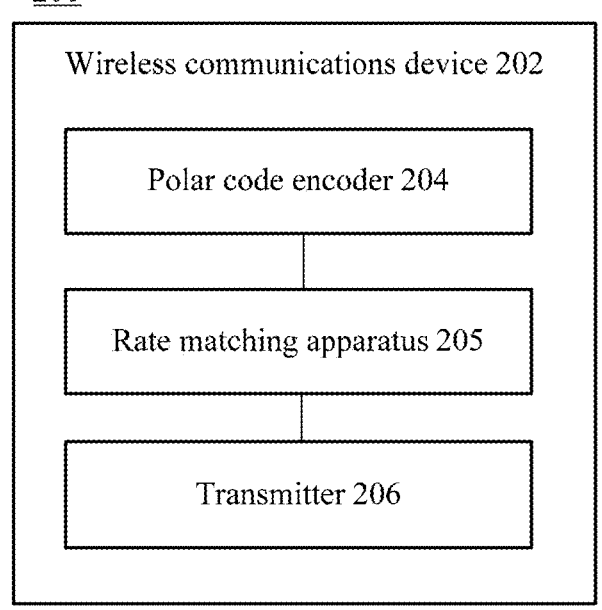
FIG. 2 shows a schematic block diagram of a system that is used for a polar code encoding method and that is applicable to the present invention in a wireless communications environment.

FIG. 2 shows a schematic block diagram of a system that is used for a polar code encoding method and that is applicable to the present invention in a wireless communications environment. The system 200 includes a wireless communications device 202. As shown in the figure, the wireless communications device 202 sends data using a channel. Although the figure shows that the wireless communications device 202 sends data, the wireless communications device 202 may also receive data using a channel (for example, the wireless communications device 202 may simultaneously send and receive data, or the wireless communications device 202 may send and receive data at different moments, or the wireless communications device 202 may simultaneously send and receive data, and may also send and receive data at different moments). The wireless communications device 202 may be, for example, a base station (for example, the base station 102 in FIG. 1) or an access terminal (for example, the access terminal 116 in FIG. 1 or the access terminal 122 in FIG. 1).

The wireless communications device 202 may include a polar code encoder 204, a rate matching apparatus 205, and a transmitter 206. Optionally, when the wireless communications device 202 receives data using a channel, the wireless communications device 202 may further include a receiver. The receiver may independently exist, or may be integrated with the transmitter 206 to form a transceiver.

The polar code encoder 204 is configured to encode data to be transferred from the wireless communications device 202, to obtain a polar code after encoding.

In this embodiment of the present invention, the polar code encoder 204 is configured to: map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers; and perform polar code encoding on the bits after mapping, to obtain coded bits after encoding.

In addition, the transmitter 206 may subsequently transmit, on a channel, an output bit that has been processed by the rate matching apparatus 205 where rate matching has been performed. For example, the transmitter 206 may send related data to another different wireless communications apparatus (which is not shown).

A specific processing process of the polar code encoder is described in detail below. It should be noted that these examples are merely intended to help a person skilled in the art to better understand the embodiments of the present invention, and are not intended to limit the scope of the embodiments of the present invention.

Figure 3:
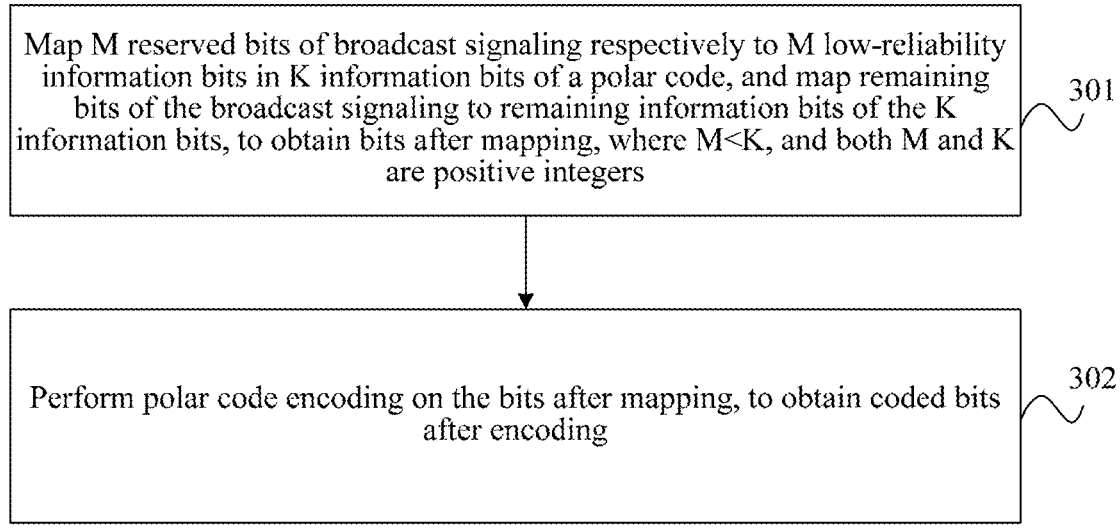
FIG. 3 is a schematic flowchart of a polar code encoding method according to an embodiment of the present invention.

FIG. 3 is a schematic flowchart of a polar code encoding method according to an embodiment of the present invention. The method shown in FIG. 3 may be performed by a wireless communications device, for example, the polar code encoder 204 in the wireless communications device shown in FIG. 2. The encoding method shown in FIG. 3 includes the following steps.

301. Map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers.

It should be understood that, the broadcast signaling refers to signaling carried on a broadcast channel (for example, a physical broadcast channel (PBCH)). The broadcast signaling generally includes multiple reserved bits that actually carry no useful information. Therefore, in a polar code encoding process, the reserved bits are mapped to low-reliability information bits, so that correct decoding of the broadcast signaling is not affected even if the reserved bits change in a transmission process.

It should also be understood that, this embodiment of the present invention does not limit a form of a reliability metric. For example, a reference may be made to an existing reliability metric for a polar code, such as a bit capacity, a Bhattacharyya parameter such as a Bhattacharyya distance, or an error probability.

For example, it is assumed that a result obtained after a cyclic redundancy check (CRC) is performed on a broadcast signaling (signaling carried on a PBCH channel) is $a_0, a_1, \ldots, a_{13}, a_{14}, \ldots, a_{23}, a_{24}, \ldots,$ and $a_{39}$, where $a_{14}, \ldots,$ and $a_{23}$ are reserved bits (the quantity is 10), and $a_{24}, \ldots,$ and $a_{39}$ correspond to check bits (which may include a mask). It is assumed that 10 low-reliability information bits in a polar code are respectively {79, 106, 55, 105, 92, 102, 90, 101, 47, 89}. Therefore, when the foregoing 10 reserved bits are mapped to the foregoing 10 low-reliability information bits, that $u(79)=a_{14}$, $u(106)=a15$, $u(55)=a_{16}$, $u(105)=a_{17}$, $u(92)=a_{18}$, $u(102)=a_{19}$, $u(90)=a_{20}$, $u(101)=a_{21}$, $u(47)=a_{22}$, and $u(89)=a_{23}$ may be achieved with an interleaver, so as to complete a process of mapping the reserved bits to the information bits. Similarly, when remaining bits of the broadcast signaling are mapped to remaining information bits of the polar code, refer to the foregoing method. To avoid repetition, details are not described herein.

302. Perform polar code encoding on the bits after mapping, to obtain coded bits after encoding.

For example, when preparing to send a broadcast signaling using a PBCH channel, the wireless communications device may first perform polar code encoding on the broadcast signaling. Encoding output of a polar code may be represented by formula (1):

$$x_1^N = u_1^N G_N \qquad (1),$$

where $u_1^N = \{u_1, u_2, \ldots, u_N\}$ is a binary row vector with a length of N; and $G_N$ is an N*N matrix, $G_N = B_N = B_N F^{\otimes n}$, where N is a length of coded bits after encoding, and $n \geq 0$; and herein, $$F = \begin{bmatrix} 1 & 0 \\ 1 & 1 \end{bmatrix},$$

$B_N$ is a transposed matrix, $F^{\otimes n}$ is a kronecker power, and it is defined as: $F^{\otimes n} = F \otimes F^{\otimes(n-1)}$.

In a polar code encoding process, some bits in $u_1^N$ are used to carry information (that is, information that needs to be sent to a receive end), where the bits are referred to as information bits, and an index set of the bits is denoted as A. Remaining bits have fixed values, and are referred to as frozen bits, and for example, usually may be set to 0.

According to the method in this embodiment of the present invention, reserved bits of a broadcast signaling are mapped, according to a length of the reserved bits, that is, a quantity M of the reserved bits, to M information bits with lowest reliability of a polar code, and remaining bits of the broadcast signaling are mapped to remaining information bits of the polar code. Then, a polar code after encoding may be obtained according to the encoding process shown in formula (1). That is, coded bits after encoding are obtained.

A polar code after encoding that is output after encoding processing performed by the polar code encoder may be simplified as: $x_1^N = u_A G_N(A)$, where $u_A$ is a set of information bits in $u_1^N$; $u_A$ is a row vector with a length of K; K is a quantity of the information bits; $G_N(A)$ is a submatrix that is formed by rows corresponding to indices in the set A and that is in $G_N$; and $G_N(A)$ is a K*N matrix.

Based on the foregoing technical solution, when a broadcast signaling is sent, mapping is first performed according to reliability of information bits in a polar code, and then polar code encoding is performed on bits after mapping. In this way, useful bits in the broadcast signaling can be prevented from being mapped to low-reliability information bits, thereby improving broadcast signaling transmission reliability.

Optionally, in an embodiment, the M low-reliability information bits include M information bits with reliability lower than a preset threshold, or the M low-reliability information bits include M information bits with lowest reliability in the K information bits.

Optionally, in another embodiment, before the M reserved bits of the broadcast signaling are respectively mapped to the M low-reliability information bits in the K information bits of the polar code, the K information bits may be sorted according to reliability of the K information bits. In this case, when the M reserved bits of the broadcast signaling are respectively mapped to the M low-reliability information bits in the K information bits of the polar code, the M reserved bits are respectively mapped to the M low-reliability information bits in the K information bits according to a sorting result.

For example, a description is made using an example in which a polar code has a code length of 128 bits. The polar code includes 40 information bits. The 40 information bits are sorted according to reliability in descending order, and indices after sorting are obtained as follows:

{127, 126, 125, 23, 119, 111, 95, 124, 122, 63, 121, 118, 117, 115, 110, 109, 107, 94, 93, 103, 91, 62, 120, 87, 61, 116, 114, 59, 108, 113, 79, 106, 55, 105, 92, 102, 90, 101, 47, 89}.

It is assumed that a broadcast signaling has a length of 40 bits, and includes 10 reserved bits. Therefore, the 10 reserved bits need to be respectively mapped to corresponding information bits {79, 106, 55, 105, 92, 102, 90, 101, 47, 89}. Remaining bits of the broadcast signaling are mapped to other information bits different from the foregoing 10 bits.

Optionally, in another embodiment, the reliability of one of the K information bits is determined according to a bit capacity, a Bhattacharyya parameter such as a Bhattacharyya distance, or an error probability.

For example, when a bit capacity is used as a reliability metric of an information bit, a bit capacity of each information bit of a polar code may be first determined, and the bit capacity is used to indicate reliability of the information bit. A bit with a larger bit capacity has higher reliability.

Alternatively, when a Bhattacharyya parameter is used as a reliability metric of an information bit, a Bhattacharyya parameter of each information bit of a polar code may be first determined, and the Bhattacharyya parameter is used to indicate reliability of the information bit. An information bit with a smaller Bhattacharyya parameter has higher reliability.

Optionally, in another embodiment, after polar code encoding is performed on the bits after mapping to obtain the coded bits after encoding, sorted congruential interleaving may be performed on the coded bits after encoding, to obtain coded bits after interleaving. Then, according to a preset value E, the first E bits of the coded bits after interleaving are input into a cyclic buffer. Alternatively, order-reversing processing is performed on the coded bits after interleaving; and according to a preset value E, the first E bits of the coded bits after order-reversing processing are input into a cyclic buffer.

It should be understood that, the preset value E is related to a frame format of the broadcast signaling. Therefore, this embodiment of the present invention can further improve encoding efficiency.

For example, the interleaving process may be performed by the rate matching apparatus 205 in the wireless communications device 202 shown in FIG. 2. The polar code encoder 204 may perform polar code encoding according to the foregoing method, and output coded bits after encoding. The rate matching apparatus 205 performs sorted congruential interleaving on the coded bits output by the polar code encoder 204. The first E bits after interleaving are captured and used as final output results, and output to a cyclic buffer. Generally, the cyclic buffer is located in the transmitter 206 shown in FIG. 2. Therefore, the transmitter transmits data in the cyclic buffer.

TABLE 1

| Length of a list | Relative performance gain between a polar code and an LTE tail-biting convolution code |
| --- | --- |
| 16 | 0.8 dB |
| 32 | 1.0 dB |
| 64 | 1.2 dB |
| 128 | 1.4 dB |
| 1024 | 1.9 dB |

Table 1 shows relative performance gains between a PBCH channel based on a polar code and a PBCH channel based on a tail-biting convolution in an LTE standard when a target packet error rate is 1% and lengths of Lists are different. It can be seen from Table 1 that, for same decoding complexity, compared with the PBCH solution based on the tail-biting convolution code in the LTE standard, the proposed PBCH solution based on the polar code has at least a gain of 0.8 dB.

Optionally, in another embodiment, when sorted congruential interleaving is performed on the coded bits after encoding, to obtain the coded bits after interleaving, a congruential sequence may be first obtained according to a length of the coded bits after encoding. Then, sorting processing is performed on the congruential sequence according to a preset rule, to obtain a reference sequence. Therefore, a mapping function may be determined according to the congruential sequence and the reference sequence; and interleaving is performed on the coded bits after encoding according to the mapping function, to obtain the coded bits after interleaving.

Optionally, in another embodiment, when the congruential sequence is obtained according to the length of coded bits after encoding, the congruential sequence may be determined according to the following formula (2):

$$x(0)=x_0;$$

and $$x(n+1)=[a*x(n)+c] \mod m,$$

where $$n=0,1,\ldots,(N-2) \quad (2),$$

where N is the length of the coded bits of the polar code after encoding, $x_0$, a, c, and m are particular parameters, and $x(0)$, $x(1)$, ..., $x(N-1)$ is the congruential sequence.

It should be understood that, that N is the length of the coded bits of the polar code after encoding means that N is a code length of the polar code.

It is assumed that Q is a given positive integer. If two integers A and B are divided by Q, and obtained remainders are the same, A and B are congruential to the modulus Q. Formula (2) represents a linear congruential method, m represents a modulus, and m>0; a represents a multiplier; c represents an increment; and x(0) represents an initial value.

Optionally, in another embodiment, $x_0=4831$, $a=7^5$, $c=0$ and $m=2^{31}-1$.

In this embodiment of the present invention, a congruential sequence may be generated using the following program based on matlab:

| | |
| --- | --- |
| function [seq_x]=multiplieCongru_interg(length, initial) | statement 1 |
| seq_x(1)=initial; | statement 2 |
| a=7^5; | statement 3 |
| c=0; | statement 4 |
| m=2^31-1; | statement 5 |
| for k=1: (length-1); | statement 6 |
| seq_x(k+1)=mod(a*seq_x(k)+c, m); | statement 7 |
| end | |

A specific description of the program is as follows:

the statement 1 defines a function multiplieCongru_interg that implements a congruential sequence, where a return value of the function is seq_x; initial is an initial value of the congruential sequence, and is an input parameter of the function; and length is a quantity of elements in the congruential sequence, that is, length=N, and N is a code length of a polar code;

the statement 2 defines the first element in the congruential sequence, that is, seq_x(1) is a preset initial value;

the statement 3 defines that a parameter $a=7^5$;

the statement 4 defines that a parameter c=0;

the statement 5 defines that a parameter $m=2^{31}-1$;

the statement 6 defines that a value range of k is [1, length−1]; and the statement 7 defines that seq_x(k+1) is a result of a*seq_x (k)+c mod m.

It should be noted that, sequence numbers of an array in matlab start from 1, and therefore, sequence numbers of pseudo codes in matlab start from 1 to N.

Afterward, the wireless communications device may perform sorting processing on the foregoing determined congruential sequence in ascending order (an example of the preset rule). In this embodiment of the present invention, for example, a sort function may be used to perform the foregoing sorting processing. The sort function may be represented as sort ([first, last]), that is, elements in [first, last] are sorted in ascending order.

Further, in this embodiment of the present invention, sorting may be performed on the generated congruential sequence using the following program based on matlab:

```
st2=4831;
[seq_x]=multiplieCongru_interg(N, st2);
[ign, p]=sort (seq_x);
Interleaver_RM=p;
```

Therefore, the congruential sequence after the sorting processing may be used as the reference sequence.

Therefore, the mapping function may be determined according to the foregoing obtained congruential sequence and reference sequence. Sorting processing is performed on the elements in the congruential sequence; therefore, the foregoing mapping function may be determined according to positions of the elements in the congruential sequence and the reference sequence.

For example but not for limitation, if a sequence A is [0, 7, 1], a sequence B that is obtained after sorting is performed on the sequence A in ascending order is [0, 1, 7]. Therefore, a mapping rule (or, a mapping function) p from the sequence A to the sequence B may be represented as [0, 2, 1]. That is, the first element (with a sequence number 0) in the sequence B is the first element (with a sequence number 0) in the sequence A; the second element (with a sequence number 1) in the sequence B is the third element (with a sequence number 2) in the sequence A; and the third element (with a sequence number 2) in the sequence B is the second element (with a sequence number 1) in the sequence A.

Similarly, the mapping function may be obtained according to the foregoing obtained reference sequence and congruential sequence. Therefore, interleaving processing may be performed on the polar code after encoding according to the foregoing obtained mapping function.

For example but not for limitation, if the mapping function p is [0, 2, 1], a bit value of the first bit (with a sequence number 0) of the polar code after interleaving is a bit value of the first bit (with a sequence number 0) of the polar code before interleaving processing; a bit value of the second bit (with a sequence number 1) of the polar code after interleaving processing is a bit value of the third bit (with a sequence number 2) of the polar code before interleaving processing; and a bit value of the third bit (with a sequence number 2) of the polar code after interleaving processing is a bit value of the second bit (with a sequence number 1) of the polar code before interleaving processing.

Figure 4:
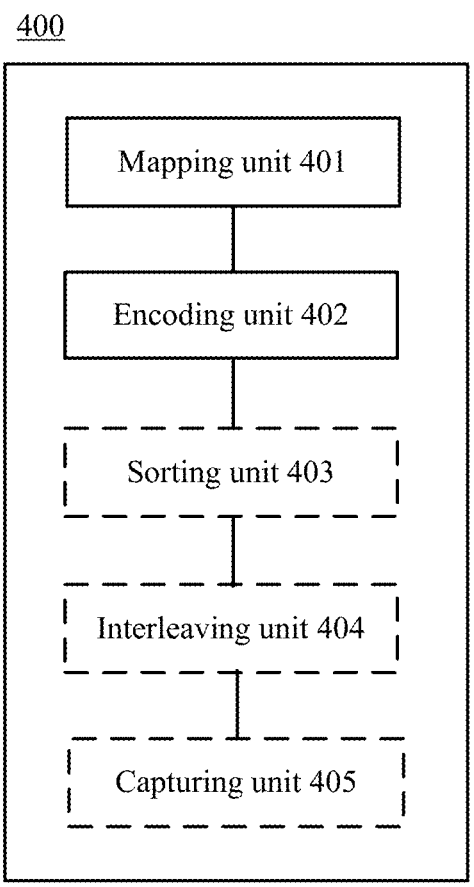
FIG. 4 is a schematic block diagram of a polar code encoding apparatus according to an embodiment of the present invention.

FIG. 4 is a schematic block diagram of a polar code encoding apparatus according to an embodiment of the present invention. The encoding apparatus 400 in FIG. 4 may be located in a base station or an access terminal (for example, the base station 102 or the access terminal 116), and includes a mapping unit 401 and an encoding unit 402.

The mapping unit 401 is configured to: map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers.

It should be understood that, the broadcast signaling refers to signaling carried on a broadcast channel (for example, a PBCH). The broadcast signaling generally includes multiple reserved bits that actually carry no useful information. Therefore, in a polar code encoding process, the reserved bits are mapped to low-reliability information bits, so that correct decoding of the broadcast signaling is not affected even if the reserved bits change in a transmission process.

It should also be understood that, this embodiment of the present invention does not limit a form of a reliability metric. For example, reference may be made to an existing reliability metric for a polar code, such as a bit capacity, a Bhattacharyya parameter such as a Bhattacharyya distance, or an error probability.

For example, it is assumed that a result obtained after a CRC is performed on a broadcast signaling (signaling carried on a PBCH channel) is $a_0, a_1, \ldots, a_{13}, a_{14}, \ldots, a_{23}, a_{24}, \ldots,$ and $a_{39}$, where $a_{14}, \ldots,$ and $a_{23}$ are reserved bits (a quantity is 10), and $a_{24}, \ldots,$ and $a_{39}$ correspond to check bits (which may include a mask). It is assumed that 10 low-reliability information bits in a polar code are respectively {79, 106, 55, 105, 92, 102, 90, 101, 47, 89}. Therefore, when the foregoing 10 reserved bits are mapped to the foregoing 10 low-reliability information bits, that $u(79)=a_{14}$, $u(106)=a_{15}$, $u(55)=a_{16}$, $u(105)=a_{17}$, $u(92)=a_{18}$, $u(102)=a_{19}$, $u(90)=a_{20}$, $u(101)=a_{21}$, $u(47)=a_{22}$, and $u(89)=a_{23}$ may be achieved using an interleaver, so as to complete a process of mapping the reserved bits to the information bits. Similarly, when remaining bits of the broadcast signaling are mapped to remaining information bits of the polar code, refer to the foregoing method. To avoid repetition, details are not described herein.

The encoding unit 402 is configured to perform polar code encoding on the bits after mapping, to obtain coded bits after encoding.

For the process in which the encoding unit performs polar code encoding on the bits after mapping, refer to the description of the foregoing embodiments. To avoid repetition, details are not described herein.

Based on the foregoing technical solution, when a broadcast signaling is sent, mapping is first performed according to reliability of information bits in a polar code, and then polar code encoding is performed on bits after mapping. In this way, useful bits in the broadcast signaling can be prevented from being mapped to low-reliability information bits, thereby improving broadcast signaling transmission reliability.

Optionally, in an embodiment, the M low-reliability information bits include M information bits with reliability lower than a preset threshold, or the M low-reliability information bits include M information bits with lowest reliability in the K information bits.

Optionally, in another embodiment, the encoding apparatus 400 further includes a sorting unit 403.

The sorting unit 403 is configured to sort the K information bits according to reliability of the K information bits.

In this case, the encoding unit 402 is configured to map, according to a sorting result, the M reserved bits respectively to the M low-reliability information bits in the K information bits.

For example, a description is made using an example in which a polar code has a code length of 128 bits. The polar code includes 40 information bits. The 40 information bits are sorted according to reliability in descending order, and indices after sorting are obtained as follows:

{127, 126, 125, 23, 119, 111, 95, 124, 122, 63, 121, 118, 117, 115, 110, 109, 107, 94, 93, 103, 91, 62, 120, 87, 61, 116, 114, 59, 108, 113, 79, 106, 55, 105, 92, 102, 90, 101, 47, 89}.

It is assumed that a broadcast signaling has a length of 40 bits, and includes 10 reserved bits. Therefore, the 10 reserved bits need to be respectively mapped to corresponding information bits {79, 106, 55, 105, 92, 102, 90, 101, 47, 89}. Remaining bits of the broadcast signaling are mapped to other information bits different from the foregoing 10 bits.

Optionally, in another embodiment, the reliability of one of the K information bits is determined according to a bit capacity, a Bhattacharyya parameter such as a Bhattacharyya distance, or an error probability.

For example, when a bit capacity is used as a reliability metric of an information bit, a bit capacity of each information bit of a polar code may be first determined, and the bit capacity is used to indicate reliability of the information bit. A bit with a larger bit capacity has higher reliability.

Alternatively, when a Bhattacharyya parameter is used as a reliability metric of an information bit, a Bhattacharyya parameter of each information bit of a polar code may be first determined, and the Bhattacharyya parameter is used to indicate reliability of the information bit. An information bit with a smaller Bhattacharyya parameter has higher reliability.

Optionally, in another embodiment, the encoding apparatus 400 further includes an interleaving unit 404 and a capturing unit 405. The interleaving unit 404 and the capturing unit 405 may be located in the rate matching apparatus 205 of the wireless communications device 202 shown in FIG. 2. Therefore, the rate matching apparatus 205 and the polar code encoder 204 together form the polar code encoding apparatus 400.

The interleaving unit 404 is configured to perform sorted congruential interleaving on the coded bits after encoding, to obtain coded bits after interleaving.

The capturing unit 405 is configured to input, according to a preset value E, the first E bits of the coded bits after interleaving into a cyclic buffer.

Alternatively, the capturing unit 405 is configured to perform order-reversing processing on the coded bits after interleaving, and input, according to a preset value E, the first E bits of the coded bits after order-reversing processing into a cyclic buffer.

It should be understood that, the preset value E is related to a frame format of the broadcast signaling. Therefore, this embodiment of the present invention can further improve encoding efficiency.

Optionally, in another embodiment, the interleaving unit 404 is configured to obtain a congruential sequence according to a length of the coded bits after encoding; then, perform sorting processing on the congruential sequence according to a preset rule, to obtain a reference sequence; determine a mapping function according to the congruential sequence and the reference sequence; and finally, interleave the coded bits after encoding according to the mapping function, to obtain the coded bits after interleaving.

For the process in which the interleaving unit 404 interleaves the coded bits after encoding, refer to the specific description of the foregoing embodiment. To avoid repetition, details are not described herein.

Optionally, in another embodiment, the interleaving unit 404 is configured to determine the congruential sequence according to the following formula (3):

$$x(0)=x_0;$$

and $$x(n+1)=[a*x(n)+c] \bmod m,$$

where $$n=0, 1, \ldots, (N-2) \quad (3),$$

where N is the length of the coded bits of the polar code after encoding, $x_0$, a, c, and m are particular parameters, and $x(0), x(1), \ldots, x(N-1)$ is the congruential sequence.

It should be understood that, that N is the length of the coded bits of the polar code after encoding means that N is a code length of the polar code.

It is assumed that Q is a given positive integer. If two integers A and B are divided by Q, and obtained remainders are the same, A and B are congruential to the modulus Q. Formula (2) represents a linear congruential method, m represents a modulus, and m>0; a represents a multiplier; c represents an increment; and x(0) represents an initial value.

Optionally, in another embodiment, $x_0=4831$, $a=7^5$, $c=0$, and $m=2^{31}-1$.

Figure 5:
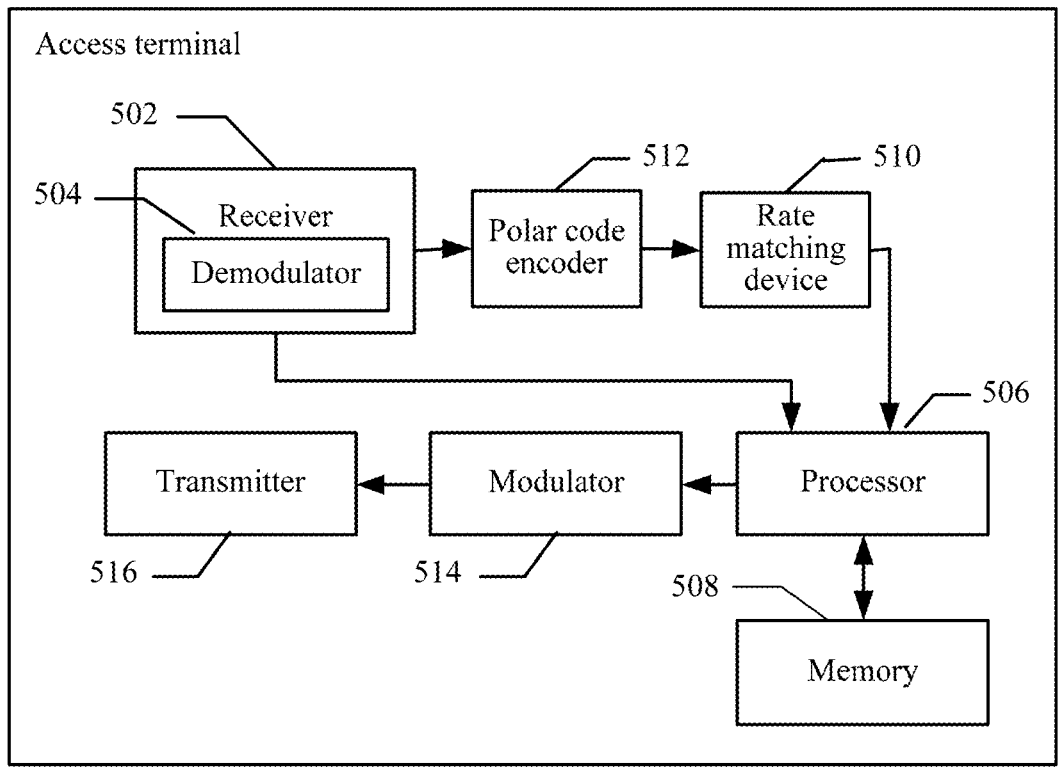
FIG. 5 is a schematic diagram of an access terminal helpful in performing the foregoing polar code encoding method in a wireless communications system.

FIG. 5 is a schematic diagram of an access terminal helpful in performing the foregoing polar code encoding method in a wireless communications system. The access terminal 500 includes a receiver 502. The receiver 502 is configured to receive a signal from, for example, a receive antenna (which is not shown), perform a typical operation (for example, filtering, amplification, or down-conversion) on the received signal, and digitize an adjusted signal to obtain a sample. The receiver 502 may be, for example, a minimum mean square error (MMSE) receiver. The access terminal 500 may further include a demodulator 504. The demodulator 504 may be configured to demodulate received symbols and provide the symbols to a processor 506 for channel estimation. The processor 506 may be a processor dedicated for analyzing information received by the receiver 502 and/or generating information to be sent by the transmitter 516, a processor configured to control one or more components of the access terminal 500, and/or a controller configured to analyze information received by the receiver 502, generate information to be sent by the transmitter 516, and control one or more components of the access terminal 500.

The access terminal 500 may additionally include a memory 508. The memory 508 is operatively coupled to the processor 506, and stores the following data: data to be sent, received data, and any other suitable information related to execution of various operations and functions in this specification. The memory 508 may additionally store a protocol and/or an algorithm related to polar code processing.

It may be understood that a data storage apparatus (for example, the memory 508) described in this specification may be a volatile memory or a non-volatile memory, or may include both a volatile memory and a non-volatile memory. For example but not for limitation, the non-volatile memory may include: a read-only memory (ROM), a programmable read-only memory (Programmable ROM, PROM), an erasable programmable read-only memory (Erasable PROM, EPROM), an electrically erasable programmable read-only memory (Electrically EPROM, EEPROM), or a flash memory. The volatile memory may include a random access memory (RAM), which is used as an external cache. For example but not for limitation, RAMs in many forms such as a static random access memory (Static RAM, SRAM), a dynamic random access memory (Dynamic RAM, DRAM), a synchronous dynamic random access memory (Synchronous DRAM, SDRAM), a double data rate synchronous dynamic random access memory (DDR SDRAM), an enhanced synchronous dynamic random access memory (Enhanced SDRAM, ESDRAM), a synchlink dynamic random access memory (Synchlink DRAM, SLDRAM), and a direct rambus random access memory (Direct Rambus RAM, DR RAM) may be used. The memory 508 in the system and the method described in this specification intends to include, but is not limited to, these memories and any other memory of a suitable type.

In addition, the access terminal 500 further includes a polar code encoder 512 and a rate matching device 510. In actual application, the receiver 502 may be further coupled to the rate matching device 510. The rate matching device 510 may be basically similar to the rate matching apparatus 205 in FIG. 2. The polar code encoder 512 is basically similar to the polar code encoder 204 in FIG. 2.

The polar code encoder 512 may be configured to: map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers; and then perform polar code encoding on the bits after mapping, to obtain coded bits after encoding.

According to this embodiment of the present invention, when a broadcast signaling is sent, mapping is first performed according to reliability of information bits in a polar code, and then polar code encoding is performed on bits after mapping. In this way, useful bits in the broadcast signaling can be prevented from being mapped to low-reliability information bits, thereby improving broadcast signaling transmission reliability.

Optionally, in an embodiment, the M low-reliability information bits include M information bits with reliability lower than a preset threshold, or the M low-reliability information bits include M information bits with lowest reliability in the K information bits.

Optionally, in another embodiment, the polar code encoder 512 sorts the K information bits according to reliability of the K information bits. Then, the polar code encoder 512 maps, according to a sorting result, the M reserved bits respectively to the M low-reliability information bits in the K information bits.

Optionally, in another embodiment, the reliability of one of the K information bits is determined according to a bit capacity, a Bhattacharyya parameter such as a Bhattacharyya distance, or an error probability.

Optionally, in another embodiment, the rate matching device 510 performs sorted congruential interleaving on the coded bits after encoding, to obtain coded bits after interleaving; and inputs, according to a preset value E, the first E bits of the coded bits after interleaving into a cyclic buffer.

Alternatively, the rate matching device 510 performs sorted congruential interleaving on the coded bits after encoding, to obtain coded bits after interleaving; and performs order-reversing processing on the coded bits after interleaving, and inputs, according to a preset value E, the first E bits of the coded bits after order-reversing processing into a cyclic buffer.

Optionally, in another embodiment, the rate matching device 510 obtains a congruential sequence according to a length of the coded bits after encoding; then, performs sorting processing on the congruential sequence according to a preset rule, to obtain a reference sequence; determines a mapping function according to the congruential sequence and the reference sequence; and finally, interleaves the coded bits after encoding according to the mapping function, to obtain the coded bits after interleaving.

Optionally, in another embodiment, the rate matching device 510 determines the congruential sequence according to the following formula (4):

$x(0)=x_0;$ and $x(n+1)=[a*x(n)+c] \bmod m,$ where $n=0,1,\ldots,(N-2)$ (4).

where N is the length of the coded bits of the polar code after encoding, $x_0$, a, c, and m are particular parameters, and $x(0), x(1), \ldots, x(N-1)$ is the congruential sequence.

It should be understood that, that N is the length of the coded bits of the polar code after encoding means that N is a code length of the polar code.

Figure 6:
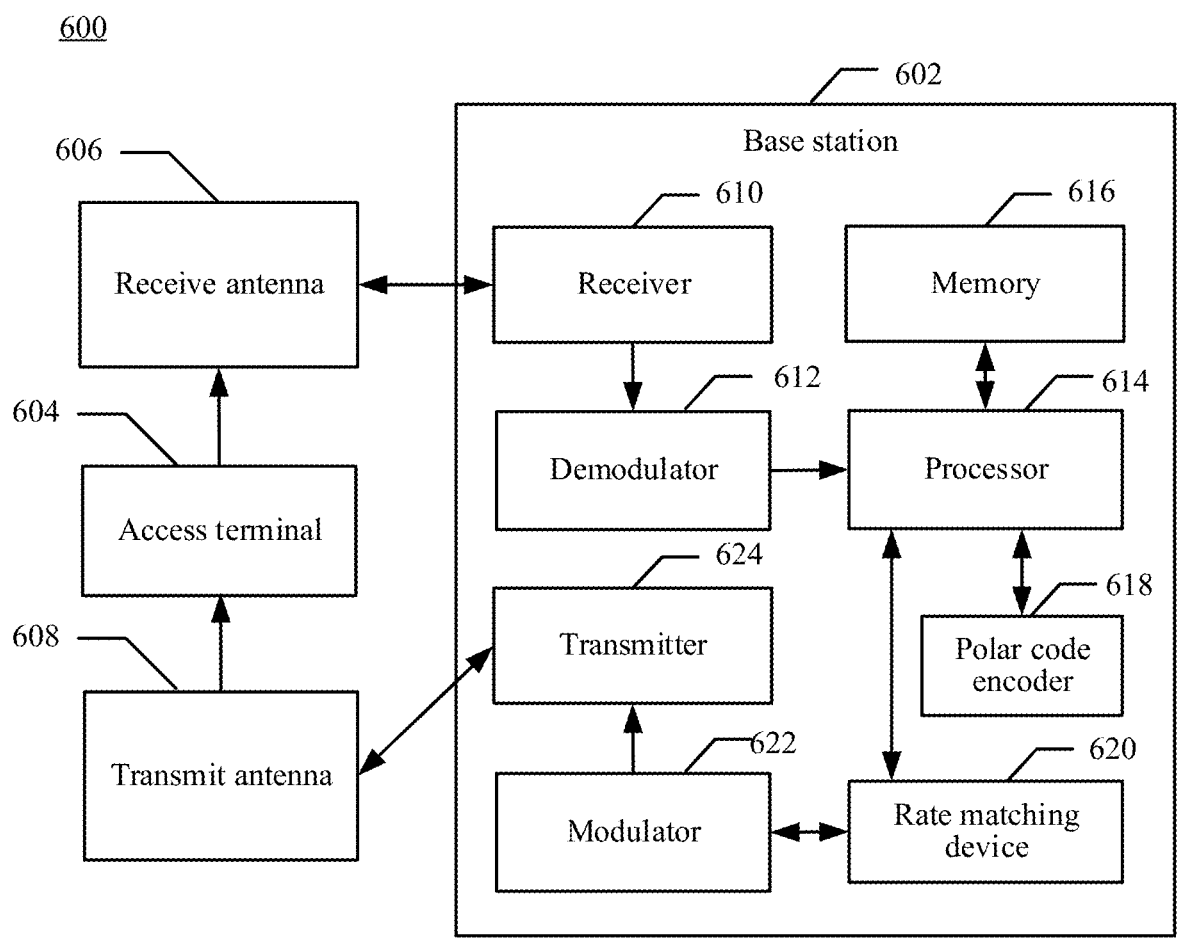
FIG. 6 is a schematic diagram of a system helpful in performing the foregoing polar code encoding method in a wireless communications environment.

FIG. 6 is a schematic diagram of a system helpful in performing the foregoing polar code encoding method in a wireless communications environment. The system 600 includes a base station 602 (for example, an access point, a NodeB, or an eNB). The base station 602 has a receiver 610 that receives a signal from one or more access terminals 604 using multiple receive antennas 606, and a transmitter 624 that transmits a signal to the one or more access terminals 604 using a transmit antenna 608. The receiver 610 may receive information from the receive antennas 606, and is operatively associated to a demodulator 612 that demodulates the received information. A demodulated symbol is analyzed by a processor 614 similar to the processor described in FIG. 5, the processor 614 is connected to a memory 616, and the memory 616 is configured to store data to be sent to the access terminal 604 (or a different base station (which is not shown)), or data received from the access terminal 604 (or a different base station (which is not shown)), and/or any other suitable information related to execution of various operations and functions in this specification. The processor 614 may be further coupled to a polar code encoder 618 and a rate matching device 620.

The polar code encoder 618 may be configured to: map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers; and then perform polar code encoding on the bits after mapping, to obtain coded bits after encoding.

According to this embodiment of the present invention, when a broadcast signaling is sent, mapping is first performed according to reliability of information bits in a polar code, and then polar code encoding is performed on bits after mapping. In this way, useful bits in the broadcast signaling can be prevented from being mapped to low-reliability information bits, thereby improving broadcast signaling transmission reliability.

Optionally, in an embodiment, the M low-reliability information bits include M information bits with reliability lower than a preset threshold, or the M low-reliability information bits include M information bits with lowest reliability in the K information bits.

Optionally, in another embodiment, the polar code encoder 618 sorts the K information bits according to reliability of the K information bits. Then, the polar code encoder 618 maps, according to a sorting result, the M reserved bits respectively to the M low-reliability information bits in the K information bits.

Optionally, in another embodiment, the reliability of one of the K information bits is determined according to a bit capacity, a Bhattacharyya parameter such as a Bhattacharyya distance, or an error probability.

Optionally, in another embodiment, the rate matching device 620 performs sorted congruential interleaving on the coded bits after encoding, to obtain coded bits after interleaving; and inputs, according to a preset value E, the first E bits of the coded bits after interleaving into a cyclic buffer.

Alternatively, the rate matching device 620 performs sorted congruential interleaving on the coded bits after encoding, to obtain coded bits after interleaving; and performs order-reversing processing on the coded bits after interleaving, and inputs, according to a preset value E, the first E bits of the coded bits after order-reversing processing into a cyclic buffer.

Optionally, in another embodiment, the rate matching device 620 obtains a congruential sequence according to a length of the coded bits after encoding; then, performs sorting processing on the congruential sequence according to a preset rule, to obtain a reference sequence; determines a mapping function according to the congruential sequence and the reference sequence; and finally, interleaves the coded bits after encoding according to the mapping function, to obtain the coded bits after interleaving.

Optionally, in another embodiment, the rate matching device 620 determines the congruential sequence according to the following formula (5):

$x(0)=x_0;$ and $$x(n+1)=[a*x(n)+c] \bmod m,$$

where $$n=0,1,\ldots,(N-2) \quad (5),$$

where N is the length of the coded bits of the polar code after encoding, $x_0$, a, c, and m are particular parameters, and x(0), x(1), . . . , x(N−1) is the congruential sequence. It should be understood that, that N is the length of the coded bits of the polar code after encoding means that N is a code length of the polar code.

In addition, in the system 600, a modulator 622 may multiplex a frame, so that the transmitter 624 sends information to the access terminal 604 using the antenna 608. Although it is shown that the polar code encoder 618, the rate matching device 620, and/or the modulator 622 are/is separated from the processor 614, it may be understood that the polar code encoder 618, the rate matching device 620, and/or the modulator 622 may be a part of the processor 614 or multiple processors (which are not shown).

It may be understood that the embodiments described in this specification may be implemented by hardware, software, firmware, middleware, microcode, or a combination thereof. For hardware implementation, a processing unit may be implemented in one or more application specific integrated circuits (ASIC), a digital signal processor (DSP), a digital signal processing device (DSP Device, DSPD), a programmable logic device (PLD), a field-programmable gate array (FPGA), a processor, a controller, a microcontroller, a microprocessor, and other electronic units configured to perform the functions described in this application, or a combination thereof.

When the embodiments are implemented in software, firmware, middleware, microcode, program code, or a code segment, they may be stored in, for example, a machine-readable medium of a storage component. The code segment may indicate a process, a function, a subprogram, a program, a routine, a subroutine, a module, a software group, a type, or any combination of an instruction, a data structure, and a program statement. The code segment may be coupled to another code segment or a hardware circuit by transferring and/or receiving information, data, an independent variable, a parameter, or memory content. The information, the independent variable, data, or the like may be transferred, forwarded, or sent in any suitable manner such as memory sharing, message transfer, token transfer, or network transmission.

For implementation by software, the technologies in this specification may be implemented by performing the functional modules (for example, a process and a function) in this specification. Software code may be stored in a storage unit and executed by a processor. The storage unit may be implemented inside the processor or outside the processor, and in the latter case, the storage unit may be coupled to the processor by means of communication using various means known in the art.

Figure 7:
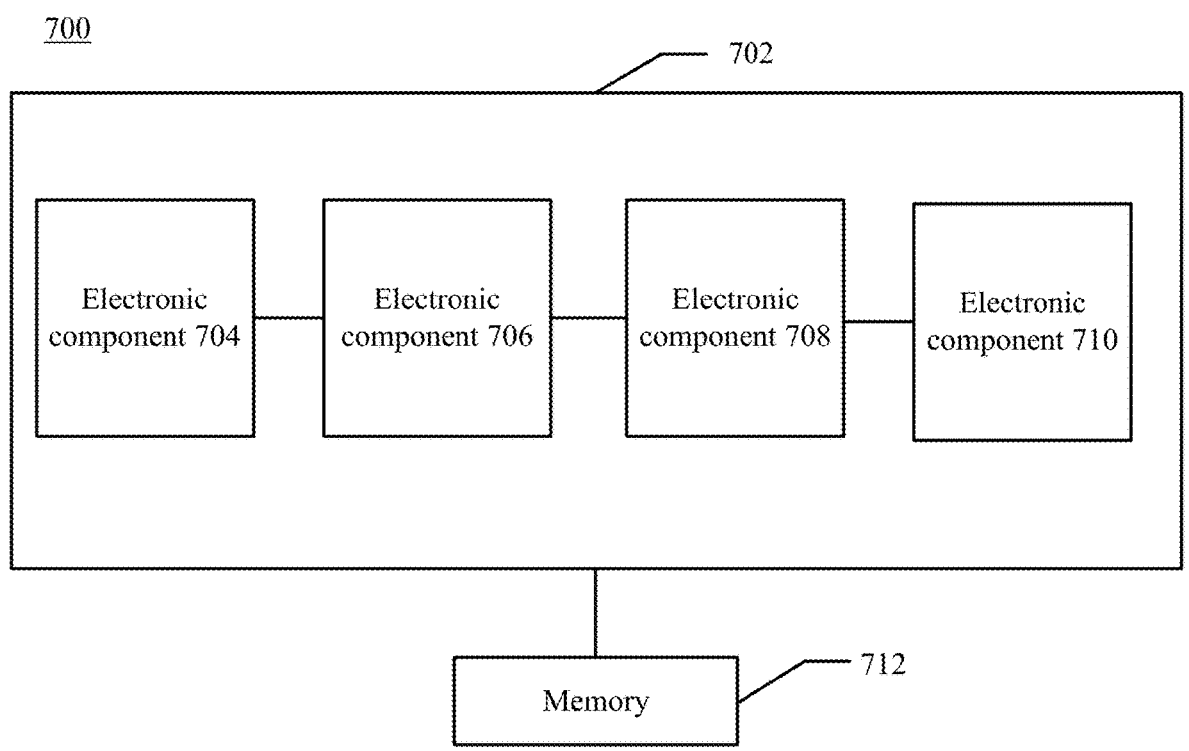
FIG. 7 shows a system in which a polar code encoding method can be used in a wireless communications environment.

FIG. 7 shows a system in which a polar code encoding method can be used in a wireless communications environment.

For example, the system 700 may at least partially reside within a base station. According to another example, the system 700 may at least partially reside within an access terminal. It should be understood that the system 700 may be indicated as including a functional block, which may indicate a functional block of a function implemented by a processor, software, or a combination thereof (for example, firmware). The system 700 includes a logical group 702 with electronic components that jointly perform an operation.

For example, the logical group 702 may be configured to: map M reserved bits of a broadcast signaling respectively to M low-reliability information bits in K information bits of a polar code, and map remaining bits of the broadcast signaling to remaining information bits of the K information bits, to obtain bits after mapping, where M<K, and both M and K are positive integers. The logical group 702 may be further configured to perform polar code encoding on the bits after mapping, to obtain coded bits after encoding.

According to this embodiment of the present invention, when a broadcast signaling is sent, mapping is first performed according to reliability of information bits in a polar code, and then polar code encoding is performed on bits after mapping. In this way, useful bits in the broadcast signaling can be prevented from being mapped to low-reliability information bits, thereby improving broadcast signaling transmission reliability.

In addition, the system 700 may include a memory 712. The memory 712 stores instructions for performing functions related to the electronic components 704, 706, and 708. Although it is shown that the electronic components 704, 706, and 708 are located outside the memory 712, it may be understood that one or more of the electronic components 704, 706, and 708 may exist inside the memory 712.

Figure 8:
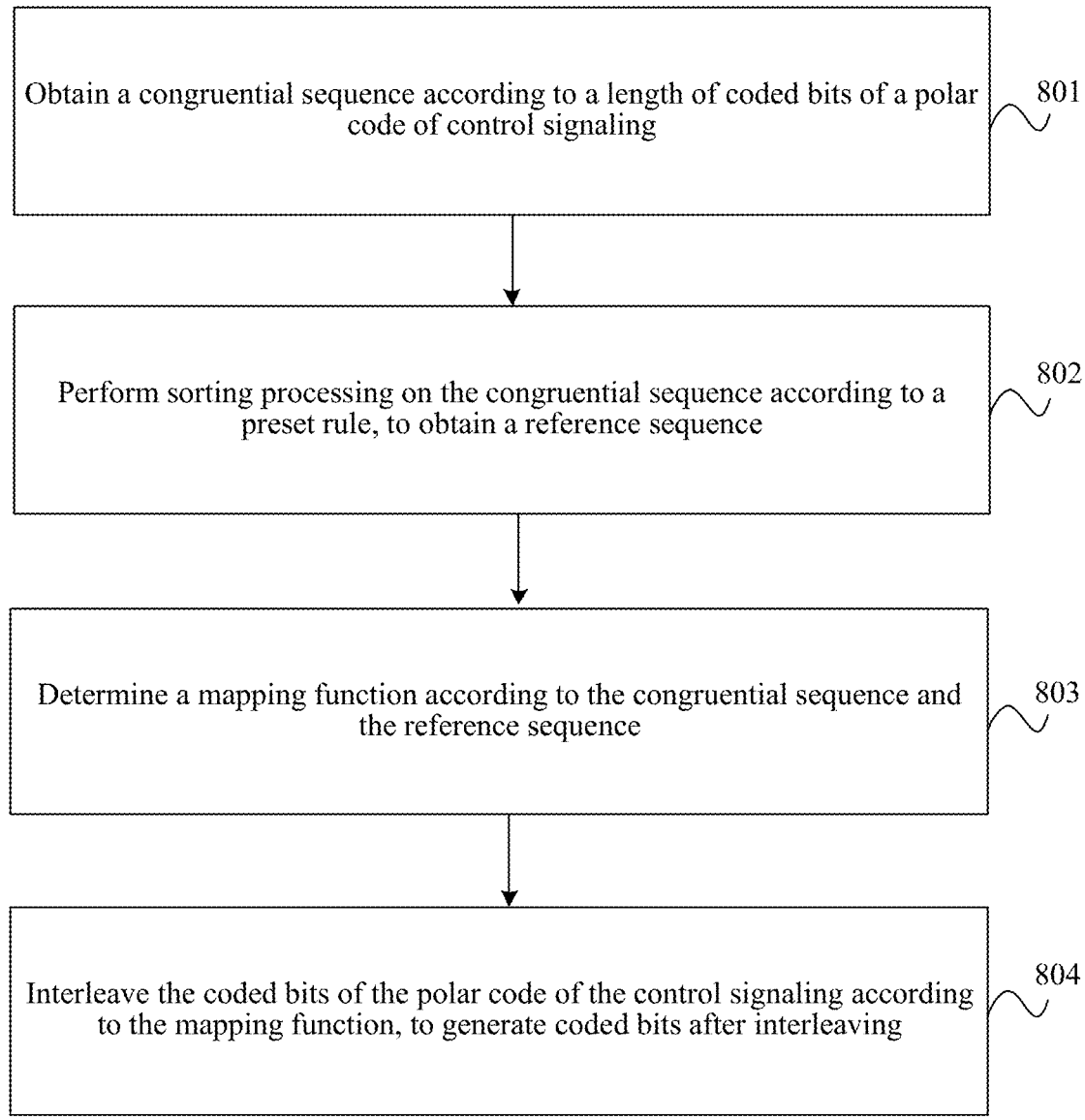
FIG. 8 is a schematic flowchart of a polar code rate matching method according to an embodiment of the present invention.

FIG. 8 is a schematic flowchart of a polar code rate matching method according to an embodiment of the present invention. The method shown in FIG. 8 may be performed by a wireless communications device, for example, the rate matching apparatus 205 in the wireless communications device shown in FIG. 2. The rate matching method shown in FIG. 8 includes the following steps:

801. Obtain a congruential sequence according to a length of coded bits of a polar code of a control signaling.

802. Perform sorting processing on the congruential sequence according to a preset rule, to obtain a reference sequence.

803. Determine a mapping function according to the congruential sequence and the reference sequence.

804. Interleave the coded bits of the polar code of the control signaling according to the mapping function, to generate coded bits after interleaving.

According to the polar code rate matching method in this embodiment of the present invention, a congruential sequence is determined based on a length of coded bits of a polar code of a control signaling; and the coded bits of the polar code of the control signaling are interleaved using the congruential sequence, so that a bit sequence structure after interleaving can be more even, a frame error rate can be lowered, and communication reliability can be improved; and the method is applicable to a rate matching process for polar codes with different code lengths, and has good universality and applicability.

In step 801, a transmit end may perform, using, for example, a polar code encoder, polar code encoding processing on information that needs to be sent to a receive end, to generate a polar code (that is, coded bits of a control signaling). The polar code is a linear block code, and is theoretically proved to be an encoding manner that can achieve a Shannon capacity and has low coding-decoding complexity. Encoding output of a polar code may be represented as follows:

$$x_1^N = u_1^N G_N,$$

where $u_1^N=\{u_1, u_2, \ldots, u_N\}$ is a binary row vector with a length of N; $G_N$ is an N*N matrix, and $G_N=B_N F^{\otimes n}$, where a code length $N=2^n$, and $n\geq 0$ and herein, $$F = \begin{bmatrix} 1 & 0 \\ 1 & 1 \end{bmatrix},$$

$B_N$ is a transposed matrix, $F^{\otimes n}$ is a kronecker power, and it is defined as: $F^{\otimes n}=F\otimes F^{\otimes(n-1)}$.

In a polar code encoding process, some bits in $u_1^N$ are used to carry information (that is, data information that needs to be sent to a receive end), the bits are referred to as information bits, and an index set of the bits is denoted as A. Remaining bits have fixed values, and are referred to as frozen bits, and for example, usually may be set to 0.

Therefore, a polar code bit sequence that is output after encoding processing performed by the polar code encoder may be simplified as: $x_1^N=u_A G_N(A)$, where $u_A$ is a set of information bits in $u_1^N$; $u_A$ is a row vector with a length of K; K is a quantity of the information bits; $G_N(A)$ is a submatrix that is formed by rows corresponding to indices in the set A and that is in $G_N$; $G_N(A)$ is a K*N matrix; and performance of the polar code depends on selection of the set A.

It should be understood that, the foregoing examples of a process of obtaining a polar code are merely descriptions for illustration, and the present invention is not limited thereto. Other methods for performing encoding processing on information to obtain a bit sequence with a polar code feature shall fall within the protection scope of the present invention.

It should also be understood that, the coded bits of the polar code of the control signaling refer to coded bits obtained by performing polar code encoding on the control signaling.

Optionally, in an embodiment, the control signaling is a broadcast signaling. In this case, according to a preset value E, the first E bits of the coded bits after interleaving are input into a cyclic buffer; or order-reversing processing is performed on the coded bits after interleaving, and according to a preset value E, the first E bits of the coded bits after order-reversing processing are input into a cyclic buffer.

Optionally, in another embodiment, when the congruential sequence is obtained according to the length of the coded bits of the polar code of the control signaling, the congruential sequence is determined according to the following formula:

$x(0)=x_0$;

and $x(n+1)=[a*x(n)+c]\bmod m$, where $n=0, 1, \ldots, (N-2)$, where N is the length of the coded bits of the polar code of the control signaling, $x_0$, a, c, and m are particular parameters, and $x(0), x(1), \ldots, x(N-1)$ is the congruential sequence. It should be understood that, that N is the length of the coded bits of the polar code of the control signaling means that N is a code length of the polar code.

It is assumed that Q is a given positive integer. If two integers A and B are divided by Q, and obtained remainders are the same, A and B are congruential to the modulus Q. Formula (2) represents a linear congruential method, m represents a modulus, and m>0; a represents a multiplier; c represents an increment; and x(0) represents an initial value.

Therefore, the mapping function may be determined according to the foregoing obtained congruential sequence and reference sequence. Sorting processing is performed on elements in the congruential sequence; therefore, the foregoing mapping function may be determined according to positions of the elements in the congruential sequence and the reference sequence.

For example but not for limitation, if a sequence A is [0, 7, 1], a sequence B that is obtained after sorting is performed on the sequence A in ascending order is [0, 1, 7]. Therefore, a mapping rule (or, a mapping function) p from the sequence A to the sequence B may be represented as [0, 2, 1]. That is, the first element (with a sequence number 0) in the sequence B is the first element (with a sequence number 0) in the sequence A; the second element (with a sequence number 1) in the sequence B is the third element (with a sequence number 2) in the sequence A; and the third element (with a sequence number 2) in the sequence B is the second element (with a sequence number 1) in the sequence A.

Similarly, the mapping function may be obtained according to the foregoing obtained reference sequence and congruential sequence. Therefore, interleaving processing may be performed on the polar code after encoding according to the foregoing obtained mapping function.

For example but not for limitation, if the mapping function p is [0, 2, 1], a bit value of the first bit (with a sequence number 0) of the polar code after interleaving is a bit value of the first bit (with a sequence number 0) of the polar code before interleaving processing; a bit value of the second bit (with a sequence number 1) of the polar code after interleaving processing is a bit value of the third bit (with a sequence number 2) of the polar code before interleaving processing; and a bit value of the third bit (with a sequence number 2) of the polar code after interleaving processing is a bit value of the second bit (with a sequence number 1) of the polar code before interleaving processing.

Optionally, in another embodiment, the control signaling includes but is not limited to one of the following control channels: a physical downlink control channel PDCCH, a physical broadcast channel PBCH, or a physical uplink control channel PUCCH. It should be understood that, the control signaling may also be referred to as a control channel.

Optionally, in another embodiment, when N=128, the mapping function is:

{0, 112, 35, 14, 48, 1, 99, 54, 28, 120, 126, 46, 114, 110, 43, 32, 81, 18, 113, 63, 75, 38, 64, 7, 15, 37, 19, 70, 27, 12, 34, 50, 17, 86, 3, 68, 98, 23, 111, 62, 57, 61, 89, 59, 13, 56, 66, 107, 47, 41, 124, 30, 2, 49, 44, 88, 65, 45, 123, 104, 10, 85, 102, 103, 122, 91, 121, 58, 73, 60, 26, 8, 55, 105, 94, 82, 115, 69, 74, 83, 106, 95, 9, 108, 53, 90, 29, 11, 36, 42, 87, 39, 101, 76, 4, 67, 93, 31, 97, 119, 100, 72, 6, 5, 22, 118, 25, 117, 125, 92, 80, 77, 21, 79, 116, 33, 20, 71, 52, 109, 84, 51, 96, 24, 40, 78, 16, 127}.

In this case, the congruential sequence is:

{4831, 81195000, 985810000, 707190000, 1586500000, 1714800000, 1700400000, 585280000, 1278700000, 1462300000, 1076700000, 1500100000, 645300000, 845220000, 38367000, 586604271, 2108042967, 692938163, 407887860, 603461796, 1964624238, 1878495441, 1715782340, 743376464, 2015855849, 1787239071, 1273295708, 606422001, 177182145, 1487976273, 970150996, 1631941748, 383819152, 1955095723, 646533714, 24877378, 1502264528, 594684317, 470422681, 1506694960, 2042510943, 955321706, 1504167770, 370217906, 992220783, 1044180926, 312459998, 917669471, 43246343, 991814115, 651762791, 2010628637, 1980316514, 1478089592, 160944248, 1308064563, 851016002, 784856594, 1240215484, 825361806, 1258997469, 814087592, 751843707, 443404601, 532873917, 1005115029, 861925101, 1597973492, 709990662, 1393913502, 605122991, 1967041192, 1698052026, 1250215999, 1400292945, 450239142, 1584371213, 1877237738, 2052404489, 1879908509, 1842896099, 398095212, 1374667679, 1410606527, 1991920056, 1077808109, 696325518, 1504588523, 999362636, 818220065, 1486840714, 1212163706, 1805531300, 1620626990, 1342726029, 1438206727, 2012013704, 1636817466, 725632992, 154065231, 1656542782, 1536537366, 1092655187, 1123062412, 1076185001, 1334036773, 1426769131, 906382315, 1466060034, 1991109407, 338132248, 746962174, 3858056, 417837782, 328076384, 1389264039, 1918493289, 1797232165, 1723502100, 1640363964, 202082762, 1233335027, 1149637945, 1054569556, 967989001, 1802513782, 297325845, 2108513993}.

Optionally, in another embodiment, when N=256, the mapping function is:

{0, 188, 112, 128, 183, 35, 150, 14, 48, 149, 148, 154, 130, 1, 229, 152, 131, 197, 182, 248, 253, 99, 54, 245, 231, 165, 28, 226, 120, 132, 136, 185, 168, 196, 187, 200, 159, 211, 147, 126, 46, 157, 114, 110, 210, 43, 32, 81, 18, 113, 63, 158, 75, 222, 38, 170, 219, 208, 237, 220, 252, 64, 137, 230, 216, 133, 7, 192, 218, 15, 37, 217, 19, 70, 27, 173, 155, 12, 34, 239, 50, 207, 175, 169, 223, 242, 240, 17, 161, 86, 3, 68, 98, 23, 145, 111, 62, 189, 202, 57, 61, 89, 59, 13, 56, 66, 199, 167, 214, 179, 215, 221, 107, 47, 41, 124, 234, 30, 2, 49, 44, 88, 201, 65, 195, 205, 45, 123, 104, 10, 85, 193, 102, 177, 103, 122, 225, 241, 181, 227, 91, 172, 121, 58, 142, 174, 73, 134, 60, 250, 180, 26, 8, 55, 236, 105, 94, 235, 194, 82, 162, 160, 243, 115, 69, 74, 83, 106, 191, 95, 232, 9, 108, 206, 53, 212, 209, 90, 29, 11, 139, 36, 42, 87, 39, 178, 101, 144, 151, 138, 247, 76, 4, 238, 143, 67, 146, 93, 254, 31, 198, 97, 119, 100, 171, 163, 204, 72, 6, 5, 22, 118, 190, 233, 141, 213, 25, 117, 125, 92, 246, 153, 80, 186, 135, 77, 251, 21, 79, 249, 116, 203, 164, 129, 33, 20, 71, 184, 52, 244, 109, 84, 51, 96, 24, 255, 40, 224, 176, 78, 140, 228, 16, 127, 166, 156}.

In this case, the congruential sequence is:

{4831, 81194617, 985812074, 707191113, 1586533693, 1714817099, 1700440153, 585277195, 1278713105, 1462300206, 1076705974, 1500095396, 645304792, 845221794, 38366853, 586604271, 2108042967, 692938163, 407887860, 603461796, 1964624238, 1878495441, 1715782340, 743376464, 2015855849, 1787239071, 1273295708, 606422001, 177182145, 1487976273, 970150996, 1631941748, 383819152, 1955095723, 646533714, 24877378, 1502264528, 594684317, 470422681, 1506694960, 2042510943, 955321706, 1504167770, 370217906, 992220783, 1044180926, 312459998, 917669471, 43246343, 991814115, 651762791, 2010628637, 1980316514, 1478089592, 160944248, 1308064563, 851016002, 784856594, 1240215484, 825361806, 1258997469, 814087592, 751843707, 443404601, 532873917, 1005115029, 861925101, 1597973492, 709990662, 1393913502, 605122991, 1967041192, 1698052026, 1250215999, 1400292945, 450239142, 1584371213, 1877237738, 2052404489, 1879908509, 1842896099, 398095212, 1374667679, 1410606527, 1991920056, 1077808109, 696325518, 1504588523, 999362636, 818220065, 1486840714, 1212163706, 1805531300, 1620626990, 1342726029, 1438206727, 2012013704, 1636817466, 725632992, 154065231, 1656542782, 1536537366, 1092655187, 1123062412, 1076185001, 1334036773, 1426769131, 906382315, 1466060034, 1991109407, 338132248, 746962174, 3858056, 417837782, 328076384, 1389264039, 1918493289, 1797232165, 1723502100, 1640363964, 202082762, 1233335027, 1149637945, 1054569556, 967989001, 1802513782, 297325845, 2108513993, 19537557, 1950206155, 71942924, 111430407, 205110265, 576970420, 1253182735, 1870101016, 217118420, 534568687, 1571827008, 1500181709, 2095967383, 1749544340, 1245627656, 1593423436, 1546610762, 745013646, 1614686312, 281998645, 54817586, 48683339, 29609066, 1570849805, 108716417, 1835720569, 58046734, 633882600, 2145969080, 314476195, 444154098, 244768114, 1386507993, 694784754, 1378771739, 1668066243, 1937818163, 172875139, 2114570429, 878326000, 222492522, 662787827, 477331400, 1657418255, 1218226548, 624501738, 1248127677, 661603443, 2046225982, 1116956416, 1531925285, 886821112, 1265919204, 1183570799, 133396632, 24266556, 1973597409, 219241501, 1857452702, 237786075, 3495458, 766104137, 1747766794, 1435183092, 585904140, 1078359485, 1373367362, 1031015178, 226549003, 120587290, 1633503909, 869255315, 242828664, 1002426548, 773781521, 1932540862, 1671590406, 1038883588, 1474413406, 652311909, 502236628, 1480274086, 368512907, 253590001, 1479591159, 1775460700, 882709835, 887163369, 575781662, 601079852, 585997076, 492851190, 505523851, 894056225, 459895516, 670291859, 2043545698, 1166579815, 181253595, 1197359719, 2103024843, 105190328, 554801215, 170025231, 1460806907, 1748633445, 968600920, 1349618180, 1310471646, 504670690, 1587364827, 651300708, 686850597, 1173381154, 674724877, 1387351579, 1988032774, 168768945, 1821244575, 1573151334, 135808674, 1908750804, 1264043942, 1878297070, 529244590, 136558256, 1622073596, 2033512954}.

Optionally, in another embodiment, $a=7^5$, $c=0$, and $m=2^{31}-1$.

Figure 9:
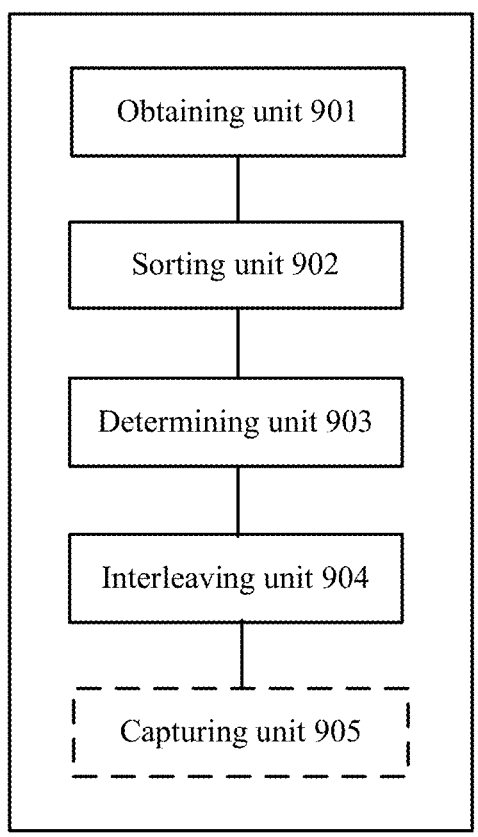
FIG. 9 is a schematic block diagram of a polar code rate matching apparatus according to an embodiment of the present invention.

FIG. 9 is a schematic block diagram of a polar code rate matching apparatus according to an embodiment of the present invention. The rate matching apparatus 900 in FIG. 9 includes an obtaining unit 901, a sorting unit 902, a determining unit 903, and an interleaving unit 904.

The obtaining unit 901 is configured to obtain a congruential sequence according to a length of coded bits of a polar code of a control signaling.

The sorting unit 902 is configured to perform sorting processing on the congruential sequence according to a preset rule, to obtain a reference sequence.

The determining unit 903 is configured to determine a mapping function according to the congruential sequence and the reference sequence.

The interleaving unit 904 is configured to interleave the coded bits of the polar code of the control signaling according to the mapping function, to generate coded bits after interleaving.

According to the polar code rate matching apparatus in this embodiment of the present invention, a congruential sequence is determined based on a length of coded bits of a polar code of a control signaling; and the coded bits of the polar code of the control signaling are interleaved using the congruential sequence, so that a bit sequence structure after interleaving can be more even, a frame error rate can be lowered, and communication reliability can be improved; and the apparatus is applicable to a rate matching process for polar codes with different code lengths, and has good universality and applicability.

Optionally, in an embodiment, the control signaling is a broadcast signaling, and the rate matching apparatus further includes a capturing unit 905. The capturing unit 905 is configured to:

input, according to a preset value E, the first E bits of the coded bits after interleaving into a cyclic buffer; or perform order-reversing processing on the coded bits after interleaving; and input, according to a preset value E, the first E bits of the coded bits after order-reversing processing into a cyclic buffer.

Optionally, in another embodiment, the obtaining unit 901 is configured to:

determine the congruential sequence according to the following formula:

$x(0)=x_0;$ and $x(n+1)=[a*x(n)+c] \bmod m,$ where $n=0,1,\ldots,(N-2),$ where N is the length of the coded bits of the polar code of the control signaling, $x_0$, a, c, and m are particular parameters, and $x(0), x(1), \ldots x(N-1)$ is the congruential sequence. It should be understood that, that N is the length of the coded bits of the polar code of the control signaling means that N is a code length of the polar code.

It is assumed that Q is a given positive integer. If two integers A and B are divided by Q, and obtained remainders are the same, A and B are congruential to the modulus Q. Formula (2) represents a linear congruential method, m represents a modulus, and m>0; a represents a multiplier; c represents an increment; and x(0) represents an initial value.

Therefore, the mapping function may be determined according to the foregoing obtained congruential sequence and reference sequence. Sorting processing is performed on elements in the congruential sequence; therefore, the foregoing mapping function may be determined according to positions of the elements in the congruential sequence and the reference sequence.

For example but not for limitation, if a sequence A is [0, 7, 1], a sequence B that is obtained after sorting is performed on the sequence A in ascending order is [0, 1, 7]. Therefore, a mapping rule (or, a mapping function) p from the sequence A to the sequence B may be represented as [0, 2, 1]. That is, the first element (with a sequence number 0) in the sequence B is the first element (with a sequence number 0) in the sequence A; the second element (with a sequence number 1) in the sequence B is the third element (with a sequence number 2) in the sequence A; and the third element (with a sequence number 2) in the sequence B is the second element (with a sequence number 1) in the sequence A.

Similarly, the mapping function may be obtained according to the foregoing obtained reference sequence and congruential sequence. Therefore, interleaving processing may be performed on the polar code after encoding according to the foregoing obtained mapping function.

For example but not for limitation, if the mapping function p is [0, 2, 1], a bit value of the first bit (with a sequence number 0) of the polar code after interleaving is a bit value of the first bit (with a sequence number 0) of the polar code before interleaving processing; a bit value of the second bit (with a sequence number 1) of the polar code after interleaving processing is a bit value of the third bit (with a sequence number 2) of the polar code before interleaving processing; and a bit value of the third bit (with a sequence number 2) of the polar code after interleaving processing is a bit value of the second bit (with a sequence number 1) of the polar code before interleaving processing.

Optionally, in another embodiment, $a=7^5$, $c=0$, and $m=2^{31}-1$.

Optionally, in another embodiment, the control signaling includes but is not limited to one of the following control channels: a physical downlink control channel PDCCH, a physical broadcast channel PBCH, or a physical uplink control channel PUCCH. It should be understood that, the control signaling may also be referred to as a control channel.

Optionally, in another embodiment, when N=128, the mapping function is:

{0, 112, 35, 14, 48, 1, 99, 54, 28, 120, 126, 46, 114, 110, 43, 32, 81, 18, 113, 63, 75, 38, 64, 7, 15, 37, 19, 70, 27, 12, 34, 50, 17, 86, 3, 68, 98, 23, 111, 62, 57, 61, 89, 59, 13, 56, 66, 107, 47, 41, 124, 30, 2, 49, 44, 88, 65, 45, 123, 104, 10, 85, 102, 103, 122, 91, 121, 58, 73, 60, 26, 8, 55, 105, 94, 82, 115, 69, 74, 83, 106, 95, 9, 108, 53, 90, 29, 11, 36, 42, 87, 39, 101, 76, 4, 67, 93, 31, 97, 119, 100, 72, 6, 5, 22, 118, 25, 117, 125, 92, 80, 77, 21, 79, 116, 33, 20, 71, 52, 109, 84, 51, 96, 24, 40, 78, 16, 127}.

In this case, the congruential sequence is:

{4831, 81195000, 985810000, 707190000, 1586500000, 1714800000, 1700400000, 585280000, 1278700000, 1462300000, 1076700000, 1500100000, 645300000, 845220000, 38367000, 586604271, 2108042967, 692938163, 407887860, 603461796, 1964624238, 1878495441, 1715782340, 743376464, 2015855849, 1787239071, 1273295708, 606422001, 177182145, 1487976273, 970150996, 1631941748, 383819152, 1955095723, 646533714, 24877378, 1502264528, 594684317, 470422681, 1506694960, 2042510943, 955321706, 1504167770, 370217906, 992220783, 1044180926, 312459998, 917669471, 43246343, 991814115, 651762791, 2010628637, 1980316514, 1478089592, 160944248, 1308064563, 851016002, 784856594, 1240215484, 825361806, 1258997469, 814087592, 751843707, 443404601, 532873917, 1005115029, 861925101, 1597973492, 709990662, 1393913502, 605122991, 1967041192, 1698052026, 1250215999, 1400292945, 450239142, 1584371213, 1877237738, 2052404489, 1879908509, 1842896099, 398095212, 1374667679, 1410606527, 1991920056, 1077808109, 696325518, 1504588523, 999362636, 818220065, 1486840714, 1212163706, 1805531300, 1620626990, 1342726029, 1438206727, 2012013704, 1636817466, 725632992, 154065231, 1656542782, 1536537366, 1092655187, 1123062412, 1076185001, 1334036773, 1426769131, 906382315, 1466060034, 1991109407, 338132248, 746962174, 3858056, 417837782, 328076384, 1389264039, 1918493289, 1797232165, 1723502100, 1640363964, 202082762, 1233335027, 1149637945, 1054569556, 967989001, 1802513782, 297325845, 2108513993}.

Optionally, in another embodiment, when N=256, the mapping function is:

{0, 188, 112, 128, 183, 35, 150, 14, 48, 149, 148, 154, 130, 1, 229, 152, 131, 197, 182, 248, 253, 99, 54, 245, 231, 165, 28, 226, 120, 132, 136, 185, 168, 196, 187, 200, 159, 211, 147, 126, 46, 157, 114, 110, 210, 43, 32, 81, 18, 113, 63, 158, 75, 222, 38, 170, 219, 208, 237, 220, 252, 64, 137, 230, 216, 133, 7, 192, 218, 15, 37, 217, 19, 70, 27, 173, 155, 12, 34, 239, 50, 207, 175, 169, 223, 242, 240, 17, 161, 86, 3, 68, 98, 23, 145, 111, 62, 189, 202, 57, 61, 89, 59, 13, 56, 66, 199, 167, 214, 179, 215, 221, 107, 47, 41, 124, 234, 30, 2, 49, 44, 88, 201, 65, 195, 205, 45, 123, 104, 10, 85, 193, 102, 177, 103, 122, 225, 241, 181, 227, 91, 172, 121, 58, 142, 174, 73, 134, 60, 250, 180, 26, 8, 55, 236, 105, 94, 235, 194, 82, 162, 160, 243, 115, 69, 74, 83, 106, 191, 95, 232, 9, 108, 206, 53, 212, 209, 90, 29, 11, 139, 36, 42, 87, 39, 178, 101, 144, 151, 138, 247, 76, 4, 238, 143, 67, 146, 93, 254, 31, 198, 97, 119, 100, 171, 163, 204, 72, 6, 5, 22, 118, 190, 233, 141, 213, 25, 117, 125, 92, 246, 153, 80, 186, 135, 77, 251, 21, 79, 249, 116, 203, 164, 129, 33, 20, 71, 184, 52, 244, 109, 84, 51, 96, 24, 255, 40, 224, 176, 78, 140, 228, 16, 127, 166, 156}.

In this case, the congruential sequence is:
{4831, 81194617, 985812074, 707191113, 1586533693, 1714817099, 1700440153, 585277195, 1278713105, 1462300206, 1076705974, 1500095396, 645304792, 845221794, 38366853, 586604271, 2108042967, 692938163, 407887860, 603461796, 1964624238, 1878495441, 1715782340, 743376464, 2015855849, 1787239071, 1273295708, 606422001, 177182145, 1487976273, 970150996, 1631941748, 383819152, 1955095723, 646533714, 24877378, 1502264528, 594684317, 470422681, 1506694960, 2042510943, 955321706, 1504167770, 370217906, 992220783, 1044180926, 312459998, 917669471, 43246343, 991814115, 651762791, 2010628637, 1980316514, 1478089592, 160944248, 1308064563, 851016002, 784856594, 1240215484, 825361806, 1258997469, 814087592, 751843707, 443404601, 532873917, 1005115029, 861925101, 1597973492, 709990662, 1393913502, 605122991, 1967041192, 1698052026, 1250215999, 1400292945, 450239142, 1584371213, 1877237738, 2052404489, 1879908509, 1842896099, 398095212, 1374667679, 1410606527, 1991920056, 1077808109, 696325518, 1504588523, 999362636, 818220065, 1486840714, 1212163706, 1805531300, 1620626990, 1342726029, 1438206727, 2012013704, 1636817466, 725632992, 154065231, 1656542782, 1536537366, 1092655187, 1123062412, 1076185001, 1334036773, 1426769131, 906382315, 1466060034, 1991109407, 338132248, 746962174, 3858056, 417837782, 328076384, 1389264039, 1918493289, 1797232165, 1723502100, 1640363964, 202082762, 1233335027, 1149637945, 1054569556, 967989001, 1802513782, 297325845, 2108513993, 19537557, 1950206155, 71942924, 111430407, 205110265, 576970420, 1253182735, 1870101016, 217118420, 534568687, 1571827008, 1500181709, 2095967383, 1749544340, 1245627656, 1593423436, 1546610762, 745013646, 1614686312, 281998645, 54817586, 48683339, 29609066, 1570849805, 108716417, 1835720569, 58046734, 633882600, 2145969080, 314476195, 444154098, 244768114, 1386507993, 694784754, 1378771739, 1668066243, 1937818163, 172875139, 2114570429, 878326000, 222492522, 662787827, 477331400, 1657418255, 1218226548, 624501738, 1248127677, 661603443, 2046225982, 1116956416, 1531925285, 886821112, 1265919204, 1183570799, 133396632, 24266556, 1973597409, 219241501, 1857452702, 237786075, 3495458, 766104137, 1747766794, 1435183092, 585904140, 1078359485, 1373367362, 1031015178, 226549003, 120587290, 1633503909, 869255315, 242828664, 1002426548, 773781521, 1932540862, 1671590406, 1038883588, 1474413406, 652311909, 502236628, 1480274086, 368512907, 253590001, 1479591159, 1775460700, 882709835, 887163369, 575781662, 601079852, 585997076, 492851190, 505523851, 894056225, 459895516, 670291859, 2043545698, 1166579815, 181253595, 1197359719, 2103024843, 105190328, 554801215, 170025231, 1460806907, 1748633445, 968600920, 1349618180, 1310471646, 504670690, 1587364827, 651300708, 686850597, 1173381154, 674724877, 1387351579, 1988032774, 168768945, 1821244575, 1573151334, 135808674, 1908750804, 1264043942, 1878297070, 529244590, 136558256, 1622073596, 2033512954}.

It should be understood that sequence numbers of the foregoing processes do not necessarily mean execution sequences in various embodiments of the present invention. The execution sequences of the processes should be determined according to functions and internal logic of the processes, and should not be construed as any limitation on the implementation processes of the embodiments of the present invention.

A person of ordinary skill in the art may be aware that, the units and steps in the examples described with reference to the embodiments disclosed herein may be implemented by electronic hardware, computer software, or a combination thereof To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present invention. The foregoing storage medium includes: any medium that can store program code, such as a Universal Serial Bus (USB) flash drive, a removable hard disk, a read-only memory (ROM), a random access memory (RAM), a magnetic disk, or an optical disc.

The foregoing descriptions are merely specific embodiments of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims. Additionally, statements made herein characterizing the invention refer to an embodiment of the invention and not necessarily all embodiments.

What is claimed is:

1. A polar code encoding method, comprising:
    mapping, by a polar code encoding apparatus, M reserved bits of a broadcast signaling to M low-reliability information bits in K information bits of a polar code respectively, and mapping remaining bits of the broadcast signaling to remaining information bits of the K information bits, to obtain K bits after mapping, wherein M<K, and both M and K are positive integers; and
    performing, by the polar code encoding apparatus, polar code encoding on the K bits after mapping, to obtain coded bits after encoding.

2. The method according to claim 1, wherein the M low-reliability information bits have reliability lower than a threshold, or the M low-reliability information bits have the lowest reliability out of the K information bits.

3. The method according to claim 1, wherein before mapping the M reserved bits of the broadcast signaling respectively to the M low-reliability information bits in the K information bits of the polar code, the method further comprises:
    sorting the K information bits according to reliability of the K information bits.

4. The method according to claim 3, wherein the reliability of one of the K information bits is determined according to a bit capacity, a Bhattacharyya parameter, or an error probability.

5. A polar code encoding apparatus, comprising:
    a memory comprising processor-executable instructions stored thereon; and
    a processor coupled to the memory, wherein the processor is configured to execute the processor-executable instructions to facilitate:
        mapping M reserved bits of a broadcast signaling to M low-reliability information bits in K information bits of a polar code respectively, and mapping remaining bits of the broadcast signaling to remaining information bits of the K information bits, to obtain K bits after mapping, wherein M<K, and both M and K are positive integers; and
        performing a polar code encoding on the K bits after mapping, to obtain coded bits after encoding.

6. The apparatus according to claim 5, wherein the M low-reliability information bits have reliability lower than a threshold, or the M low-reliability information bits have the lowest reliability out of the K information bits.

7. The apparatus according to claim 6, wherein the processor is further configured to execute the processor-executable instructions to facilitate:
    sorting the K information bits according to reliability of the K information bits.

8. The apparatus according to claim 5, wherein the reliability of one of the K information bits is determined according to a bit capacity, a Bhattacharyya parameter, or an error probability.

9. A non-transitory computer-readable storage medium having instructions stored thereon, wherein the instructions, when executed, facilitate:
    mapping M reserved bits of a broadcast signaling to M low-reliability information bits in K information bits of a polar code respectively, and mapping remaining bits of the broadcast signaling to remaining information bits of the K information bits, to obtain K bits after mapping, wherein M<K, and both M and K are positive integers; and
    performing a polar code encoding on the K bits after mapping, to obtain coded bits after encoding.

10. The non-transitory computer-readable storage medium according to claim 9, wherein the M low-reliability information bits are M information bits with reliability lower than a threshold, or the M low-reliability information bits are M information bits with lowest reliability in the K information bits.

11. The non-transitory computer-readable storage medium according to claim 10, wherein the K information bits are sorted according to reliability of the K information bits.

12. The non-transitory computer-readable storage medium according to claim 9, wherein the reliability of one of the K information bits is determined according to a bit capacity, a Bhattacharyya parameter, or an error probability.

* * * * *